(12) United States Patent
Okumoto

(10) Patent No.: US 8,094,096 B2
(45) Date of Patent: Jan. 10, 2012

(54) ORGANIC ELECTROLUMINESCENCE DISPLAY DEVICE AND MANUFACTURING METHOD THEREOF

(75) Inventor: Kenji Okumoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/855,027

(22) Filed: Aug. 12, 2010

(65) Prior Publication Data

US 2010/0302221 A1 Dec. 2, 2010

Related U.S. Application Data

(63) Continuation of application No. PCT/JP2009/005490, filed on Oct. 20, 2009.

(30) Foreign Application Priority Data

Dec. 18, 2008 (JP) ................... 2008-322882

(51) Int. Cl.
*G09G 3/30* (2006.01)
(52) U.S. Cl. .......................... 345/76; 345/204
(58) Field of Classification Search .............. 345/76, 345/82, 156, 204; 257/88
See application file for complete search history.

(56) References Cited

U.S. PATENT DOCUMENTS

| | | | |
|---|---|---|---|
| 6,566,807 B1 | 5/2003 | Fujita et al. |
| 6,864,638 B2 | 3/2005 | Ishihara et al. |
| 6,900,470 B2 | 5/2005 | Kobayashi et al. |
| 7,158,161 B2 | 1/2007 | Gyoutok et al. |
| 7,408,197 B2 | 8/2008 | Ishihara et al. |
| 7,785,718 B2 | 8/2010 | Yatsunami et al. |
| 2002/0158835 A1 | 10/2002 | Kobayashi et al. |
| 2003/0137325 A1 | 7/2003 | Yamazaki et al. |
| 2003/0146693 A1 | 8/2003 | Ishihara et al. |
| 2004/0256620 A1 | 12/2004 | Yamazaki et al. |
| 2005/0012105 A1 | 1/2005 | Yamazaki et al. |
| 2005/0012454 A1 | 1/2005 | Yamazaki et al. |
| 2005/0127372 A1 | 6/2005 | Ishihara et al. |
| 2005/0170208 A1 | 8/2005 | Yatsunami et al. |
| 2006/0113899 A1 | 6/2006 | Matsumoto et al. |

(Continued)

FOREIGN PATENT DOCUMENTS

JP 2000-196140 7/2000

(Continued)

OTHER PUBLICATIONS

Japan Office Action for JP 2010-518459, mail date is Jan. 18, 2011.

(Continued)

*Primary Examiner* — Ricardo L Osorio
(74) *Attorney, Agent, or Firm* — Greenblum & Bernstein, P.L.C.

(57) ABSTRACT

An organic electroluminescence display includes a first electrode and an auxiliary wire each either on or in a substrate. A luminescent layer is over the first electrode, and a hole transport layer is between the luminescent layer and the first electrode. The hole transport layer extends from over the first electrode to over the auxiliary wire. A second electrode is over the luminescent layer and extends from over the first electrode to over the auxiliary wire. A metal layer is over the auxiliary wire between the hole transport layer and the second electrode. The second electrode and the auxiliary wire are electrically connected via the hole transport layer and the metal layer. The metal layer comprises a metal, wherein a difference of a work function value of the metal minus an absolute value of an energy level of a lowest unoccupied molecular orbit of the hole transport layer is at most approximately 0.5 eV.

20 Claims, 15 Drawing Sheets

U.S. PATENT DOCUMENTS

| | | | |
|---|---|---|---|
| 2007/0029929 A1 | 2/2007 | Nakamura et al. |
| 2007/0063639 A1 | 3/2007 | Hamano et al. |
| 2007/0065180 A1 | 3/2007 | Yatsunami |
| 2007/0114921 A1 | 5/2007 | Yamazaki et al. |
| 2007/0205718 A1 | 9/2007 | Yamazaki et al. |
| 2007/0222380 A1 | 9/2007 | Yamazaki et al. |
| 2007/0241665 A1 | 10/2007 | Sakanoue et al. |
| 2007/0290604 A1 | 12/2007 | Sakanoue et al. |
| 2008/0012480 A1 | 1/2008 | Yatsunami et al. |
| 2008/0164474 A1 | 7/2008 | Yamazaki et al. |
| 2008/0299861 A1 | 12/2008 | Ishihara et al. |
| 2009/0160325 A1 | 6/2009 | Yatsunami et al. |
| 2009/0267490 A1 | 10/2009 | Birnstock et al. |
| 2009/0284141 A1 | 11/2009 | Sakanoue et al. |
| 2010/0102310 A1 | 4/2010 | Komatsu et al. |
| 2010/0187513 A1 | 7/2010 | Okumoto |
| 2010/0237341 A1 | 9/2010 | Okumoto et al. |
| 2010/0258797 A1 | 10/2010 | Yamamoto et al. |
| 2010/0258833 A1 | 10/2010 | Okumoto et al. |

FOREIGN PATENT DOCUMENTS

| | | |
|---|---|---|
| JP | 2002-318556 | 10/2002 |
| JP | 2003-288994 | 10/2003 |
| JP | 2003-303687 | 10/2003 |
| JP | 2005-031651 | 2/2005 |
| JP | 2005-038833 | 2/2005 |
| JP | 2006-114453 | 4/2006 |
| JP | 2006-156267 | 6/2006 |
| JP | 2007-073499 | 3/2007 |
| JP | 2007-73499 | 3/2007 |
| JP | 2008-533655 | 8/2008 |
| WO | 2009/110186 | 9/2009 |

OTHER PUBLICATIONS

A partial English language translation of Paragraph No. [0043] of JP 2006-114453. The publication date of JP 2006-114453 being Apr. 27, 2006.

U.S. Appl. No. 12/934,720 to Masanao Okawa et al., which was filed Sep. 27, 2010.

U.S. Appl. No. 12/668,724 to Hiroshi Hayata et al., which was filed Jan. 12, 2010.

Yasuhiko Shirota et al., "Charge Carrier Transporting Molecular Materials and Their Applications in Devices", Chem. Rev. 2007, pp. 953-1010 (published Apr. 11, 2007).

ORGANIC ELECTROLUMINESCENCE DISPLAY DEVICE AND MANUFACTURING METHOD THEREOF

CROSS REFERENCE TO RELATED APPLICATION

This is a continuation application of PCT Application No. PCT/JP2009/005490 filed Oct. 20, 2009, designating the United States of America, the disclosure of which, including the specification, drawings, and claims, is incorporated herein by reference in its entirety.

The disclosure of Japanese Patent Application No. 2008-322882 filed on Dec. 18, 2008 including specification, drawings and claims is incorporated herein by reference in its entirety.

BACKGROUND OF THE INVENTION

1. Field of the Invention

The present invention relates to display devices employing organic electroluminescence (EL) elements and manufacturing methods thereof, in particular, to a display device with luminance variation of an organic EL element reduced, and a manufacturing method thereof.

2. Description of the Related Art

Recent years have seen a rapidly increasing demand for flat-screen display devices such as a flat-screen liquid crystal display with light weight and low-power consumption, compared with conventional Cathode-Ray Tube displays. The liquid crystal display, however, has problems in viewing angle and responsiveness.

In order to overcome the problems, passive-matrix and active-matrix display devices have recently attracted attention. The passive-matrix and active-matrix display devices employ a self-luminous organic electroluminescence element (referred to as "organic EL element", hereinafter) which provides a wide viewing angle and quick responsiveness. In particular, actively developed is the active-matrix display device which is advantageous in achieving high-definition and a larger screen.

A display device employing organic EL elements includes a display panel using the organic EL elements, and a driving circuit driving the organic EL elements. The display panel includes the organic EL elements each having: a first electrode including aluminum (Al); a second electrode including Indium Tin Oxide (ITO) and facing the first electrode; and a luminescent layer provided between the first and the second electrodes. The first electrode, the second electrode, and the luminescent layer are provided on a substrate, such as glass, in matrix. The driving circuit includes a thin-film transistor (TFT) separately driving each organic EL element.

Further, studies are conducted on (i) the bottom-emission display device taking the light emitted by the organic EL element outside via the substrate, and (ii) the top-emission display device taking the light at the second electrode side facing the substrate. In the bottom-emission display device utilizing the active matrix technique, however, the TFT of the driving circuit is formed on the substrate. This makes difficult to secure an enough opening ratio.

Concurrently, the top-emission technique is free from restriction, caused by the TFT transistor, in opening ratio. Compared with the bottom-emission technique, the top-emission technique makes possible improving use efficiency of the emitted light. Here, the top-emission technique involves taking the light outside via the second electrode formed on the top surface of the luminescent layer. This requires the second electrode to achieve high optical transparency as well as high conductivity. A typical transparent electrically-conductive material of which the second electrode is made is metallic oxide, such as the ITO; however, the metallic oxide is higher than a metallic material in resistivity. Thus, a larger area in display panel causes a greater difference of the second electrode in wire length among luminescent pixels, and develops a significant voltage reduction between an edge of the power supply unit and the center of the display panel. Depending on the voltage reduction, the luminance varies, and thus the center of the panel becomes dark. In other words, a problem arises in that the voltage varies depending on arrangement positions of the organic EL elements provided on the display panel, and the voltage variation cause deterioration in display quality.

In order to prevent the problem, there is an effective structure which enables to supply, for each pixel, the power from a low-resistance wire provided in the lower part to a transparent electrode provided in the upper part.

Disclosed in Patent Reference 1 (Japanese Unexamined Patent Application Publication No. 2002-318556), for example, is a display device shown in FIG. 16.

FIG. 16 is a cross-sectional view of a luminescent pixel included in a conventional display device in accordance with Patent Reference 1. Briefly described hereinafter is a display device 700 of Patent Reference 1 with reference to FIG. 16. According to FIG. 16, the display device 700 includes a first electrode 720 and an auxiliary wire 730 both provided on a same surface of a substrate 710. The first electrode 720 and the auxiliary wire 730 include a low-resistivity electrically-conductive material, and are separately provided each other using the photolithography technique. Then, provided on the first electrode 720 is a light modulating layer 750. Provided over the light modulation layer 750 is a second electrode 760 including a transparent electrically-conductive material. Further, a part of the second electrode 760 is connected to the auxiliary wire 730 in an opening part 745. Here, the opening part 745 is partially provided on a barrier 740.

Similarly, Patent Reference 2 (Japanese Unexamined Patent Application Publication No. 2003-303687) discloses an organic luminescent display device with (i) a first electrode and a second power supply line each provided in a discrete layer of a single glass substrate, and (ii) a second electrode and a second power supply line connected via a contact hole. This makes possible reducing wiring resistance caused by the second electrode to decrease variation found on the display surface.

The conventional display devices disclosed in Patent References 1 and 2, however, have the second electrode and an auxiliary wire directly connected together. Thus, an overcurrent, flowing through the second electrode and the auxiliary wire, could affect the display device including a driving circuit. In addition, the overcurrent also flows through a luminescent unit, which possibly affects the reliability and the life time of the luminescent unit. Here, a regular current required to illuminate luminescent units per one sub-pixel is as much as 3 µA to 5 µA. Compared with the regular current, the overcurrent is a pulsed current several tens to several hundreds of times as great as the regular current. The overcurrent occurs by: static electricity in manufacturing a display panel; a current caused by some sort of noise, from outside, found in a finished display device; and short circuit caused by other pixels.

Further, the conventional display devices disclosed in Patent References 1 and 2 have the second electrode and the auxiliary wire directly connected together via a connecting part. In order to realize the structure, all the layers involving luminescent operation, including an electron injection layer, an electron transport layer, a hole injection layer, a hole transport layer, and a luminescent layer, are required to be formed, avoiding coating the connecting unit. Realizing the structure via the vacuum evaporation technique, for example, requires a use of high-definition mask. The use of the high-definition mask, however, faces an alignment problem in manufacturing a large-screen and high-definition display device in high productivity.

Proposed in Patent Reference 3 is a structure to realize a connecting unit which eliminates the use of the above high-definition mask and keeps the overcurrent off.

FIG. 17 is a cross-sectional view of a luminescent pixel included in a conventional display device in accordance with Patent Reference 3 (Japanese Unexamined Patent Publication Application No. 2007-73499). A luminescent device 800 shown in FIG. 17 has at least one of a first buffer layer 850 and a second buffer layer 870 provided between an auxiliary wire 830 and a second electrode 880. The auxiliary wire 830 is separated from a first electrode 820 by a barrier 840 and formed on a substrate 810. The first buffer layer 850 and the second buffer layer 870 represent structural layers of a luminescent unit including a luminescent layer 860.

The first buffer layer 850: includes a combination of a metallic compound and an organic material; and is entirely p-doped, including the luminescent unit and the connecting unit. The second buffer layer 870: includes a combination of an electron-transporting substance and an electron-donating substance; and entirely n-doped, including the luminescent unit and the connecting unit.

This structure allows (i) the luminescent device 800 to have an auxiliary wire formed near each luminescent pixel, and (ii) the connecting unit to have appropriate conductivity by a carrier doped in the first buffer layer 850 and in the second buffer layer 870. This makes possible reducing luminance variation among luminescent elements due to the voltage reduction of the second electrode 880.

The first buffer layer 850 and the second buffer layer 870 included in the conventional luminescent device 800 shown in FIG. 17 are respectively p-doped and n-doped in advance. In order to realize the buffer layers with p-doped and n-doped, both of the layers need to be mixtures of a dopant and a transporting material in being formed in layer. A manufacturing process employing the co-evaporation technique involves forming the buffer layers including the above mixtures.

SUMMARY OF THE INVENTION

The process forming the above mixtures, as represented by the co-evaporation technique, requires a complex scheme for stabilizing evaporating speeds of the two materials to be mixed. This leads to an increase in the number of manufacturing schemes. The process also results in an increasing cost of the depositing system in order to satisfy the specifications including a process to stabilize the evaporating speeds.

As described above, realizing the luminescent device shown in Patent Reference 3 requires the complex process for forming the buffer layers, which consequently increases the number of the manufacturing schemes and the cost of the buffer-layer forming system.

The present invention is conceived in view of the above problems and has as an object to provide an electroluminescence display device and a manufacturing method thereof, the electroluminescence display device which prevents an overcurrent from flowing into a pixel, significantly reduces luminance variations among pixels, and is simplified in manufacturing process thereof.

In order to achieve the above object, an organic electroluminescence display device according to an aspect of the present invention includes: a substrate; a first electrode formed either on or in the substrate; an auxiliary wire formed either on or in the substrate, with electrically insulated from the first electrode; a luminescent layer formed over the first electrode and including a luminescent substance; a hole transport layer intercalated between the luminescent layer and the first electrode, and transporting holes to the luminescent layer; and a second electrode formed over the luminescent layer, wherein the hole transport layer and the second electrode extend from over the first electrode and to over the auxiliary wire, a metal layer is formed between the hole transport layer and the second electrode both provided over the auxiliary wire, the second electrode and the auxiliary wire are electrically connected via the hole transport layer and the metal layer, the metal layer includes metal having a value of 0.5 ev or below, the value being obtained by subtracting (i) an absolute value of an energy level of a lowest unoccupied molecular orbit of the hole transport layer from (ii) a work function value, and the hole transport layer provided over the first electrode is formed of a non-n-doped organic material.

The present invention can realize an organic EL display device having high displaying quality, the organic EL display device which prevents an overcurrent from flowing into a pixel, and has significantly few luminance variations, even on a large panel, among pixels due to voltage reduction, taking advantage of reduced wiring resistance. Further, the present invention can provide a manufacturing method of an organic EL display device with high productivity thanks to its simplified manufacturing process.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Figure 1A:
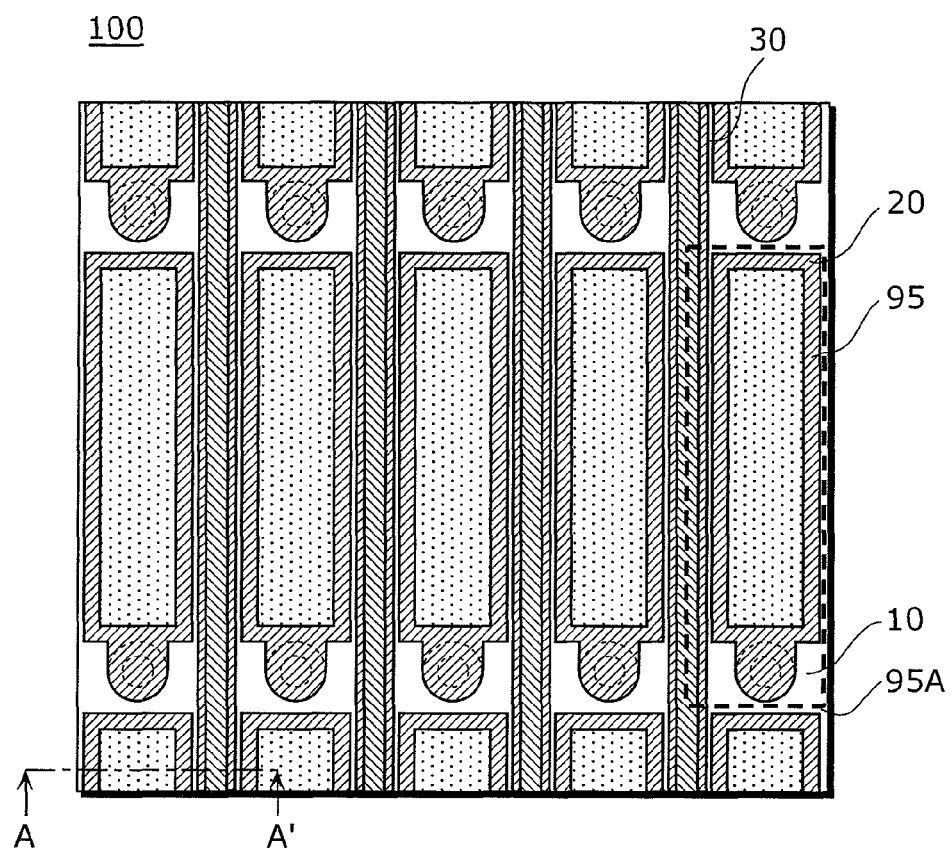
FIG. 1A is a partial plan view illustrating a main section of an organic EL display device in accordance with Embodiment 1 of the present invention.

An organic electroluminescence display device according to an aspect of the present invention includes: a substrate; a first electrode formed either on or in the substrate; an auxiliary wire formed either on or in the substrate, with electrically insulated from the first electrode; a luminescent layer formed over the first electrode and including a luminescent substance; a hole transport layer intercalated between the luminescent layer and the first electrode, and transporting holes to the luminescent layer; and a second electrode formed over the luminescent layer, wherein the hole transport layer and the second electrode extend from over the first electrode and to over the auxiliary wire, a metal layer is formed between the hole transport layer and the second electrode both provided over the auxiliary wire, the second electrode and the auxiliary wire are electrically connected via the hole transport layer and the metal layer, and the metal layer includes metal of which work function is as great as, or smaller than, an absolute value of an energy level of a lowest unoccupied molecular orbit of the hole transport layer.

According to the aspect, the work function of the metal atoms included in the metal layer is approximately as great as, or smaller than, the absolute value of the energy level of the lowest unoccupied molecular orbit of the hole transport layer. Hence, in the connecting unit electrically connecting the auxiliary wire and the second electrode, electrons can be easily supplied from the metal atoms to the hole transport layer. Thus, the hole transport layer, which is not n-doped in the luminescent unit, is n-doped in the connecting unit. This leads to fewer luminance variations among luminescent elements due to the voltage reduction of the second electrode.

In addition, the layers provided in the connecting unit can have an electrical resistance set higher than that of: the metal of the auxiliary wire; and of the ITO which the second electrode is made of. This allows the layers to act as electrical buffer layers against an overcurrent so as to achieve effective reduction in the overcurrent. Further, the forming process of the luminescent unit, formed between the first electrode and the second electrode, requires no scheme for n-doping the hole transport layer. This simplifies the manufacturing process. Here, the luminescent unit includes (i) the first electrode, (ii) the luminescent layer formed over the first electrode and having a luminescent substance, and (iii) the second electrode formed over the luminescent layer. The connecting unit includes the auxiliary wire, the hole transport layer, the second electrode, and the metal layer. Here, the hole transport layer and the second electrode are provided over the auxiliary wire. The metal layer is intercalated between the hole transport layer and the second electrode.

In addition, when the hole transport layer provided over the first electrode is n-doped, the luminescent substance, included in the luminescent layer which is laminated on the hole transport layer, reacts with the doped metal atoms. This causes the luminescent substance included in the luminescent layer to deteriorate.

When forming the hole transport layer, according to the aspect, the hole transport layer is made of an organic material with no n-doped. The hole transport layer with no n-doped makes possible preventing luminance deterioration of the luminescent layer and providing a longer life-time to the luminescent layer.

In addition, a hole-transporting organic material included in the hole transport layer has the lowest unoccupied molecular orbit typically within the range of an energy level between approximately 1.7 to 2.5 eV. Concurrently, an electron transport material has the lowest unoccupied molecular orbit typically within the range of the energy level between approximately 2.5 to 3.5 eV. The metal supplying the electrons to the hole-transporting organic material is required to be smaller than the metal supplying the electrons to electron-transporting material in electron energy level; namely, work function.

As the work function of the metal supplying enough electrons to the hole transport layer, according to the aspect, required is either (i) that the difference between the work function and the absolute value of the energy level of the lowest unoccupied molecular orbit of the hole-transporting organic material is 0.5 eV or below, or (ii) that the work function is smaller than the absolute value of the energy level of the lowest unoccupied molecular orbit of the hole-transporting organic material. This provides sufficient n-doping to the hole transport layer lying in the connecting unit.

Further, in the aspect of the organic electroluminescence display device, the hole transport layer intercalated between the second electrode and the auxiliary wire is n-doped in contact with the metal layer intercalated between the second electrode and the hole transport layer.

According to the aspect, the hole transport layer intercalated between the second electrode and the auxiliary wire is n-doped by itself in contact with the metal layer intercalated between the second electrode and the hole transport layer. This provides conductivity to the hole transport layer, which is an insulated material, without a scheme for n-doping the hole transport layer. Hence, the resistance between the second electrode and the auxiliary wire can be reduced. The reduced resistance makes possible preventing the luminance deterioration of the luminescent layer to provide a longer life-time to the luminescent layer, and reducing the luminance variations among the luminescent elements due to the voltage reduction of the second electrode.

Furthermore, in the aspect of the organic electroluminescence display device, the metal layer preferably includes the metal of which value is −0.5 eV or greater, the value being obtained by subtracting (i) the absolute value of the energy level of the lowest unoccupied molecular orbit of the hole transport layer from (ii) the work function value of the metal.

According to the aspect, the difference obtained by subtracting (i) the absolute value of the energy level of the lowest unoccupied molecular orbit of the hole-transporting organic material from (ii) the work function value of the metal supplying sufficient electrons to the hole transport layer is −0.5 eV or greater. This provides sufficient n-doping to the hole transport layer lying in the connecting unit.

In addition, in the aspect of the organic electroluminescence display device, an n-dope concentration of the hole transport layer provided over the auxiliary wire is higher than an n-dope concentration of the hole transport layer provided over the first electrode.

Even though the hole transport layer in the luminescent unit is in contact with the luminescent layer, the aspect achieves the reduction of the luminance variations among the luminescent elements due to the voltage reduction of the second electrode with no decrease in luminescent efficiency observed in the luminescent unit. Here, the hole transport layer in the luminescent unit represents the hole transport layer provided over the first electrode.

In addition, even though the hole transport layer provided over the first electrode is n-doped due to the effect caused by a surrounding layer, the n-dope concentration of the hole transport layer provided over the first electrode is higher than that of the hole transport layer provided over the auxiliary wire. Thus, even though the luminescent substance included in the luminescent layer reacts with metal atoms n-doped by the hole transport layer, deterioration of the luminescent substance included in the luminescent layer can be reduced. The reduction of the deterioration makes possible preventing the luminance deterioration of the luminescent layer and providing a longer life-time to the luminescent layer.

Moreover, in the aspect of the organic electroluminescence display device, the metal layer may be formed in a single layer, and provided over said first electrode through over the auxiliary wire.

In forming the metal layer provided in the connecting unit, the aspect eliminates the needs of a patterning scheme in which the high-definition mask is used. This makes possible: simplifying the manufacturing process; and establishing advantages in enlarging a screen, and achieving high-definition.

Furthermore, in the aspect of the organic electroluminescence display device, the metal layer is an electron injection layer injecting an electron into the luminescent layer over the first electrode.

According to the aspect, the metal layer may act as an electron injection layer injecting electrons into the luminescent layer, assisting the generation of the electrons.

In addition, in the aspect of the organic electroluminescence display device, metal atoms of the metal layer diffuse, over the auxiliary wire, to the vicinity of a second principal surface of the hole transport layer, the second principal surface lying opposite a first principal surface representing an interface between the metal layer and the hold transport layer.

According to the aspect, the metal atoms of the metal layer preferably diffuse, over the auxiliary wire, to the vicinity of a second principal surface of said hole transport layer, the second principal surface lying opposite a first principal surface representing an interface between said metal layer and said hold transport layer.

Moreover, in the aspect of the organic electroluminescence display device, the metal atoms of said metal layer arrive within 5 nm from the second principal surface.

According to the aspect, the metal atoms of the metal layer preferably arrive within 5 nm from the second principal surface. This makes possible uniformly providing the n-dope in a laminating direction of the hole transport layer lying in the connecting unit, which can reduce the resistance value of the hole transport layer having a high electrical resistance with no dope provided.

Furthermore, in the aspect of the organic electroluminescence display device, the hole transport layer provided on said auxiliary wire is greater than 0 nm and is as much as 50 nm or below in film thickness.

According to the aspect, the hole transport layer provided on the auxiliary wire is preferably greater than 0 nm and is as much as 50 nm or below in film thickness. In the case where a film thickness, of the hole transport layer in the connecting unit, is thicker than 50 nm, the metal atoms of the metal layer have difficulty in uniformly diffusing in a laminating direction of the hole transport layer. Thus, the film thickness, of the hole transport layer in the connecting unit, with greater than 0 nm and 50 nm or thinner makes possible reducing the resistance value of the hole transport layer having a high electrical resistance with no dope provided.

In addition, in the aspect of the organic electroluminescence display device, the substrate includes at least a first layer and a second layer which is different from the first layer, the first electrode is formed on the first layer, and the auxiliary wire is formed on the second layer.

According to the aspect, the substrate may include at least a first layer and a second layer which is different from said first layer. Here, the first electrode may be formed on the first layer, and the auxiliary wire may be formed on the second layer.

This structure allows the position for arrangement and the area of the auxiliary wire to be less restricted by the arrangement of the first electrode, which achieves an organic EL display device having room for flexible designing. For example, providing the auxiliary wire and the first electrode to respective layers each having a different substrate makes possible having the auxiliary wire and the first electrode overlapped. This structure can significantly increase the area of the auxiliary wire. Accordingly, the enlarged area of the auxiliary wire allows the connecting area shared between the auxiliary wire and the connecting unit to be enlarged. As a result, an overcurrent can be effectively reduced. Further, the aspect allows the first electrode and the auxiliary wire to be sterically arranged, which makes possible significantly easing the restriction of a form and a size of a wiring electrode. Further, each of the first electrode and the auxiliary wire is formed out of a different material such that the material of the auxiliary wire is decided based on a required resistivity, and the material of the first electrode is decided based on the structure of the luminescent unit. Thus, the aspect can include a use of most suitable materials, which increases the range of options for the materials. In the case of the bottom-emission technique, for example, the first electrode may be formed out of a transparent conductive material, and the auxiliary wire may be formed out of a metallic material.

Moreover, the aspect of the organic electroluminescence display device may further include plural luminescent pixels (i) arranged in a matrix, and (ii) each including the first electrode, the luminescent layer, and the second electrode, wherein among first electrodes including the first electrode and luminescent layers including the luminescent layer, one first electrode and one luminescent layer in one of the luminescent pixels may be separated from one first electrode and one luminescent layer in another one of the luminescent pixels, and the auxiliary wires may be arranged at least one of per column and per row of the plurality of luminescent pixels.

The aspect makes possible reducing wiring resistance which depends on the distance between the second electrode and the auxiliary wire, curbing variations observed in driving voltage, and thus providing a color organic EL display device having high displaying quality. This aspect also improves anti-overcurrent characteristics observed between the second electrode and the auxiliary wire.

Furthermore, in the aspect of the organic electroluminescence display device, each of the luminescent pixels may include at least three sub-pixels, each of the first electrodes and each of the luminescent layers may be separately provided for an associated one of the at least three sub-pixels, and the auxiliary wires may be arranged at least one of per column and per row of the at least three sub-pixels.

The aspect makes possible significantly reducing wiring resistance which depends on the distance between the second electrode and the auxiliary wire, additionally curbing variations observed in driving voltage, and thus providing a color organic EL display device having high displaying quality.

In addition, in the aspect of the organic electroluminescence display device, each of the luminescent pixels may include at least three sub-pixels, each of the first electrodes and each of the luminescent layers may be separately provided for an associated one of the luminescent pixels, and the auxiliary wires may be arranged at least one of per column and per row of the luminescent pixels.

Taking advantage of the aspect, fewer auxiliary wires and fewer connecting points between the auxiliary wire and the second electrode are employed compared with the case where the auxiliary wire is provided per sub-pixel. This makes possible connecting the auxiliary wire and the second electrode via a wider area of the connection opening part. As a result, the voltage variations of the second electrode can be further reduced, and displaying uniformity of the display panel can be improved.

Moreover, in the aspect of the organic electroluminescence display device, the substrate may further include: an interlayer insulating layer placed below the first electrode; and a driving circuit layer placed below the interlayer insulating layer and including a driving element driving a luminescent pixel having the first electrode, the luminescent layer, and the second electrode, and the first electrode and the driving element may be connected via a conductive via provided in the interlayer insulating layer.

The aspect makes possible realizing an active-matrix organic EL display device integrating the driving circuit within the pixel unit.

Furthermore, in the aspect of the organic electroluminescence display device, the driving element may include a thin-film transistor, and the first electrode may be connected to one of a source terminal and a drain terminal of the driving element via the conductive via.

According to the aspect, variations in voltage applied to the luminescent unit can be reduced even though the interconnection resistance between the second electrode and the auxiliary wire varies. As a result, an organic EL display device having high displaying quality is realized.

A method for manufacturing an organic electroluminescence display device having luminescent pixel arranged according to another aspect of the present invention includes: first forming, one of on and in an substrate, (i) a first electrode and (ii) an auxiliary wire with electrically insulated from the first electrode; second forming of (i) a luminescent unit, over the first electrode, including a luminescent layer having a luminescent substance, and a hole transport layer formed of a non-n-doped organic material and transporting holes to the luminescent layer, and (ii) a connecting unit, over the auxiliary wire, including the hole transport layer and a metal layer which is in contact with the hole transport layer and has metal of which work function is smaller than an absolute value of an energy level of a lowest unoccupied molecular orbit of the hole transport layer; and third forming of the second electrode over at least one of the luminescent unit and the connecting unit after said second forming.

This aspect makes possible realizing a manufacturing method, for organic EL display device, utilizing characteristics units included in an organic EL display device as steps, as well as realizing the organic EL display device including such characteristic units.

Furthermore, in the other aspect of the method for manufacturing the organic electroluminescence display device, the second forming may involve forming each of the metal layer and the hole transport layer in a single layer, the metal layer and the hole transport layer being provided over the luminescent unit through over the connecting unit.

Moreover, in the other aspect of the method for manufacturing the organic electroluminescence display device, the substrate may include at least a first layer and a second layer which is different from the first layer, and the first forming may involve forming of the first electrode on the first layer, and the auxiliary wire on the second electrode.

In addition, in the other aspect of the method for manufacturing the organic electroluminescence display device, the second forming may include a use of successive dry processes in order to form (i) the metal layer formed on the auxiliary wire, and (ii) the second electrode formed in the third forming.

Moreover, the other aspect of the method for manufacturing the organic electroluminescence display device may further include before the first forming: forming of a driving circuit layer (i) included in the substrate, and (ii) having a driving element driving the luminescent pixel; and forming of an interlayer insulating layer (i) representing a top layer of the substrate, (ii) provided on the driving circuit layer, and (iii) including a conductive via having the driving element and the first electrode electrically conducted.

Described hereinafter shall be Embodiments of the present invention with reference to the drawings. It is noted in the Embodiments and each drawing below that the same structural elements share an identical numerical reference. In addition, the following description exemplifies a display device including an organic EL element of which: a top-emission anode and a top-emission cathode are respectively referred to as a first electrode and a second electrode. The above display device, however, shall not be limited to this.

Embodiment 1

Described shall be an organic electroluminescence display device (hereinafter referred to as an organic EL display device) in accordance with Embodiment 1 of the present invention with reference to the drawings.

Figure 1B:
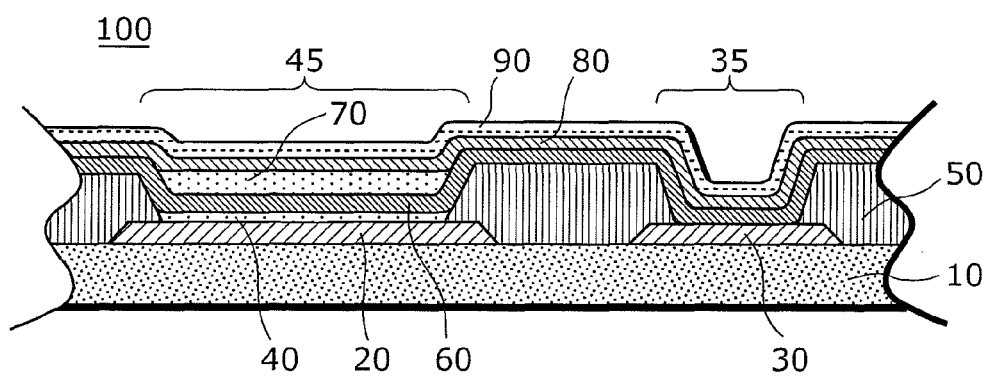
FIG. 1B is a cross-sectional view, of the main section, taken along line A-A' of FIG. 1A.

FIG. 1A is a partial plan view illustrating a main section of the organic EL display device in accordance with Embodiment 1 of the present invention. FIG. 1B is a cross-sectional view, of the main section, taken from line IA-IA of FIG. 1A.

An organic EL display device 100, in accordance with Embodiment 1, illustrated in substrate FIG. 1B includes: a substrate 10; a first electrode 20 and an auxiliary wire 30 provided on the substrate 10; a hole injection layer 40 provided on the first electrode 20; a barrier 50 forming a pixel opening part 45 and a connection opening part 35; a hole transport layer 60 provided over the substrate 10, the first electrode 20, the auxiliary wire 30, the hole injection layer 40, and the barrier 50; a luminescent layer 70 provided in the pixel opening part 45; a metal layer 80 provided over the substrate 10, the first electrode 20, the auxiliary wire 30, the hole injection layer 40, the barrier 50, the hole transport layer 60, and the luminescent layer 70; and a second electrode 90 provided on the metal layer 80.

As illustrated in FIG. 1A, the organic EL display device 100 has a matrix of luminescent pixels 95A, each including a luminescent unit 95. Each of luminescent units 30 is provided, per column of the luminescent pixel 95A, along a corresponding one of the luminescent units 95. It is noted that the hole transport layer 60, the metal layer 80, and the second electrode 90 are formed entirely over the partial plan view shown in FIG. 1A. The auxiliary wire 30 and the second electrode 90 are electrically connected via a connecting unit in a connecting opening part 35 provided along with the auxiliary wire 30, the connecting unit which includes the hole transport layer 60 and the metal layer 80.

It is noted as a layer structure, between the second electrode 90 and auxiliary wire 30, observed in the connecting opening part 35 that the layer structure shall not be limited to the above as far as the layer structure (i) may include a layer other than the hole transport layer 60 and the metal layer 80, and (ii) does not hinder a flow of a current with respect to the flow of the current. An organic EL display device in this structured laminate is also included in an implementation of the present invention, and has an effect similar to that of the organic EL display device 100, in accordance with Embodiment 1, illustrated in FIGS. 1A and 1B.

In addition, the luminescent unit 95: includes at least the luminescent layer 70, the hole transport layer 60, and the metal layer 80, all of which are provided in the pixel opening part 45; and emits light at the second electrode 90 side. Here, the emitted light is generated via recombination of holes and electrons injected into the luminescent layer 70. It is noted that each of first electrodes 20 corresponds to an associated one of the luminescent units 95, and is separately provided per pixel. In other words, in the case where the luminescent unit includes at least three sub-pixels representing "R", "G", and "B", the luminescent unit 95 and the first electrode 20 correspond to an associated one of the sub-pixels. The luminescent unit 95 and the first electrode 20 both corresponding to one of the associated sub-pixels are separated from the other luminescent unit 95 and the other first electrode 20 both corresponding to another one of associated sub-pixels.

Here, used as the substrate 10, though not shall be limited to, are a glass substrate and a quartz substrate, for example. Further, a plastic substrate made of polyethylene terephthalate or polyethersulfone may provide flexibility to the organic EL display device. In particular, the top-emission technique utilized in the Embodiment 1 may employ a non-transparent plastic substrate or a ceramic substrate.

Moreover, the first electrode 20 and the auxiliary wire 30 may preferably be made of, though shall not be limited to, a material having low electric resistivity.

In particular, the first electrode 20 and the auxiliary wire 30 may be made of one of metals listed below, an alloy thereof, or a laminate of them: silver, aluminum, nickel, chromium, molybdenum, copper, iron, platinum, tungsten, lead, tin, antimony, strontium, titanium, manganese, indium, zinc, vanadium, tantalum, niobium, lanthanum, cerium, neodymium, samarium, europium, palladium, cobalt.

Further, the hole injection layer 40 included in the luminescent unit is chiefly made of a material having hole-injection characteristics. The material having hole-injection characteristics is capable of injecting holes, injected from the first electrode 20 side, into the luminescent layer 70 in a stable manner or assisting the generation of the holes. The hole injection layer 40 may be made of, for example, polyethylene dihydroxy thiophene (PEDOT).

The hole transport layer 60 is: formed entirely over the hole injection layer 40, the barrier 50, and the auxiliary wire 30, and capable of transporting the holes, injected from the hole injection layer 40, into the luminescent layer 70. The hole transport layer 60 may be made of a hole-transporting organic material. The hole-transporting organic material is capable of transporting the generated holes via intermolecular charge transfer reaction. This is also referred to as the p-type organic semiconductor.

The hole transport layer 60, which may be made either a high polymer material or a low polymer material, is preferably deposited via the wet-printing technique, and preferably includes a crosslinker in order to make the hole transport layer 60 difficult to elute into the luminescent layer 70 when the luminescent layer 70; namely an upper layer, is formed. An exemplified hole-transporting material may be, though shall not be limited to, aromatic amine, and may preferably be a derivative of either triphenylamine or triarylamine derivative. An exemplified crosslinker may be dipentaerythritol hexaacrylate.

A technique for depositing the hole transport layer 60 may employ, though shall not limited to, the nozzle-jet technique typified by the ink-jet technique, and the dispenser technique. Here, the ink-jet technique involves injecting organic film-forming material made into ink out of a nozzle to form the hole transport layer 60.

In addition, the luminescent layer 70, forming the luminescent unit, may be made of either a low-molecular organic luminescent material, or a high molecular organic luminescent material. Employed as the high-molecular luminescent material is a polymer luminescent material such as polypara phenylene vinylene (PPV), and polyfluorene. Listed below are the low-molecular luminescent materials: $Alq_3$; be-benzoquinolinol ($BeBq_2$); fluorescent bleaching agents including (i) a benzoxazole-based agent such as 2,5-Bis (5,7-di-t-pentyl-2-benzoxazolyl)-1,3,4-thiadiazole, 4,4'-bis(5,7-benzyl-2-benzoxazolyl)stilbene, 4,4'-bis [5,7-di-(2-methyl-2-butyl)-2-benzoxazolyl]stilbene, 2,5-bis(5,7-di-t-bentyl-2-benzoxazolyl)thiophene, 2,5-Bis ([5-α, α-dimethylbenzyl]-2-benzoquinolinol)thiophene, 2,5-bis[5,7-di-(2-methyl-2-butyl)-2-benzoxazolyl]-3,4-diphenylthiophene, 2,5-bis(5-methyl-2-benzoxazolyl) thiophene, 4,4'-bis(2-benzoxazolyl) biphenyl, 5-methyl-2-[2-[4-(5-methyl-2-benzoxazolyl) phenyl] vinyl]benzoxazolyl, 2-[2-(4-chlorophenyl)vinyl] naphtho[1,2-d]oxazole, (ii) a benzothiazole-based agent such as 2,2'-(p-phenylenedivinylene)-bisbenzothiazole, and (iii) a benzimidazole-based agent such as 2-[2-4-(2-benzimidazlyl) phenyl]vinyl]benzimidazole, 2-[2-(4-carboxyphenyl)vinyl] benzoxazolyl; an 8-hydroxyquinoline-based metal complex such as, tris(8-quinolinol)aluminum, bis(8-quinolinol)magnesium, bis(benzo[f]-8-quinolinol)zinc, bis(2-methyl-8-quinolinato)aluminumoxide, tris(8-quinolinol)indium, tris (5-methyl-8-quinolinol)aluminum, 8-quinolinollithium, tris (5-chloro-8-quinolinol)gallium, bis(5-chloro-8-quinolinol) calcium, and poly[zinc-bis(8-hydroxy-5-quinolinolyl) methane]; a metal chelate oxinoid compound such as dilitiumepindolidione; a styrylbenzene-based compound such as, 1,4-bis(2-methylstyryl)benzene, 1,4-(3-methylstyryl)benzene), 1,4-bis(4-methylstyryl)benzene, distyrylbenzene, 1,4-bis(2-ethylstyryl)benzene, 1,4-bis(3-ethylstyryl)benzene), and 1,4-bis(2-methylstyryl)-2-methylbenzene; a diesterpyrazine derivative such as 2,5-bis (4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis-[2-(4-biphenyl)vinyl]pyrazine, 2,5-bis[2-(1-pyrenyl) vinyl]pyrazine; a naphthalic imide derivative; a perylene derivative; an oxadiazole derivative; an aldazines derivative; a cyclopentadiene derivative; a styrylamine derivative; a coumarin-based derivative; and an aromatic dimethylidine derivative. Further, anthracene, salicylate, pyrene, and coronene are used as the low-molecular luminescent materials. A phosphorous luminescent material such as fac-tris(2-phenylpyridine)iriduium is also used as the low-molecular luminescent material.

The metal layer 80 is capable of assisting generation of electrons and injecting the electrons into the luminescent layer 70. The metal layer 80 is chiefly made of at least one of alkali metal and alkali earth metal, and may include: two or more kinds of alkali metal and alkali earth metal; and both of the alkali metal and the alkali earth metal.

Further, the metal layer 80 is in contact with the hole transport layer 60 in the connecting opening part 35, which forms the connecting unit. In order to reduce the resistance value of the hole transport layer 60 found in the connecting unit, the metal layer 80 is capable of supplying the electrons to the hole transport layer 60 found in the connecting unit. To achieve the capability, the metal layer 80 is made of metal whose work function is as great as, or smaller than, an absolute value of an energy level of the lowest unoccupied molecular orbit of the hole transport layer 60. The laminated structure of the connecting unit allows 0.1% to 30% of metallic atoms to be diffused in the hole transport layer 60 in the connecting unit. In other words, the n-dope concentration of the hole transport layer 60 lying over the auxiliary wire 30 is higher than that of the hole transport layer 60 lying over the first electrode 20. Described hereinafter is a requirement of a metallic element included in the metal layer 80.

In order to supply the electrons from an electron-donative metal to an organic substance, the gap between the electron energy level of the electron-donative metal and that of the organic substance is preferably small. With respect to the vacuum level, a hole-transporting organic material has the lowest unoccupied molecular orbit typically within the range of an energy level between approximately 1.7 to 2.5 eV (See Chem. Rev. vol. 107, pp. 953-1010 (2007)). Concurrently, an electron transport material has the lowest unoccupied molecular orbit typically within the range of the energy level between approximately 2.5 to 3.5 eV (Chem. Rev. vol. 107, pp 953-1010 (2007)). The metal supplying the electrons to the hole-transporting organic material is preferably smaller than the metal supplying the electrons to electron-transporting material in electron energy level; namely, work function. The above concludes that as the work function of the metal supplying the electrons to the hole-transporting organic material, the value obtained by subtracting (i) the absolute value of the energy level of the lowest unoccupied molecular orbit of the hole transport layer 60 from (ii) a work function value of the metal is preferably 0.5 eV or smaller. The metal which (i) is either the alkali metal or the alkali earth metal and (ii) satisfies the above conditions may be, for example, lithium (work function: 2.9 eV), potassium (work function: 2.3 eV), rubidium (work function: 2.3 eV), cesium (work function: 2.1 eV), calcium (work function: 2.9 eV), strontium (work function: 2.6 eV) barium (work function: 2.5 eV), sodium (work function: 2.4 eV), cerium (work function: 2.9 eV), and europium (work function: 2.5 eV). The work functions of the metals exemplified above are 3.0 eV or below, which satisfies a preferable condition as the metal supplying the electrons to the above described hole-transporting organic material.

Further, the metal supplying the electrons to the hole-transporting organic material preferably has a difference value of −0.5 eV or greater obtained by subtracting (i) the absolute value of the energy level of the lowest unoccupied molecular orbit of the hole transport layer 60 from (ii) the work function value of the metal. In the case of the metal having a work function value greater than the absolute value of the energy level of the lowest unoccupied molecular orbit of the hole transport layer 60, the difference value between the work function value and the absolute value is preferably small. Concurrently, the metal, having a work function value smaller than the absolute value of the energy level of the lowest unoccupied molecular orbit of the hole transport layer 60, is capable of supplying the electrons to the hole-transporting organic material, regardless of the difference value between the work function value and the absolute value in principle. In the case where the hole-transporting organic material included in the hole transport layer 60 is 2.5 eV in energy level of the lowest unoccupied molecular orbit, cesium having the work function value of 2.1 eV is preferable as the metal supplying the electrons to the organic material of the hole transport layer 60. Here, the above difference value is −0.4 eV. In view of existing alkali metal or alkali earth metal, the difference value is derived to be −0.5 eV or greater.

A film thickness of the metal layer 80 is preferably 1 to 20 nm, more preferably 3 to 7 nm. In the case where the metal layer 80 is excessively thin, the metal layer 80 is easily degraded by either: originally contained water and oxygen; or water and oxygen incoming from outside in depositing an upper layer of the metal layer 80. This makes difficult obtaining a characteristic of high efficiency with low voltage. The water and oxygen possibly: enter either during the above-described depositing of the upper layer, or during the incoming of water and oxygen from outside; and is originally found adsorbed within the film. Thus, in general, the water and oxygen cannot be completely removed. In the case where the layer is excessively thin, concurrently, the layer either absorbs or confines in the element the emitted light generated by an organic layer since the layer is basically a metal film transmitting no light. This makes difficult achieving high-luminescent efficiency.

The upper layer is formed preferably, though shall not be limited to, via the resistance-heating vapor deposition technique and the electron beam deposition technique.

In addition, the metal atoms of the metal layer 80 preferably diffuse to the vicinity of a second principal surface of the hole transport layer 60. Here, the second principal surface lies opposite a first principal surface representing an interface lying between the metal layer 80 and the hole transport layer 60. Further, the metal atoms of the metal layer 80 preferably arrive within 5 nm from the second principal surface.

This makes possible uniformly providing the n-dope in a laminating direction of the hole transport layer 60 lying in the connecting unit, which can reduce the resistance value of the hole transport layer 60 having a high electrical resistance with no dope provided.

Further, a film thickness of the hole transport layer 60 is preferably 50 nm or thinner. In the case where a film thickness, of the hole transport layer 60 in the connecting unit, is thicker than 50 nm, the metal atoms of the metal layer 80 have difficulty in uniformly diffusing in a laminating direction of the hole transport layer 60. Thus, the film thickness, of the hole transport layer 60 in the connecting unit, with 50 nm or thinner makes possible reducing the resistance value of the hole transport layer 60 having a high electrical resistance with no dope provided.

It is noted that laminating the metal layer 80 directly above the luminescent layer 70 makes possible omitting lamination of an organic layer having an electron transporting capability, which reduces the material cost and simplifies the film-forming process. This structure is effective, in particular, for an organic EL element which employs a polymeric organic luminescent layer that is advantageous in lowering a cost thanks to the simplification via the wet technique.

The barrier 50 may be made of a resin material such as polyimid resin. Here, the resin material may include carbon particles in order to prevent the light generated by the luminescent unit from transmitting to a neighboring luminescent unit.

The second electrode 90 is preferably made of, though shall not be limited to, ITO and indium zinc oxide in the case where the top-emission technique is employed.

According to Embodiment 1, the work function of the metal atoms included in the metal layer 80 is approximately as great as, or smaller than, the absolute value of the energy level of the lowest unoccupied molecular orbit of the hole transport layer 60. In the connecting unit over the auxiliary wire 30, the electrons can be easily supplied from the metal atoms to the hole transport layer 60. Thus, the hole transport layer 60, which is not n-doped in the luminescent unit provided over the first electrode 20, is n-doped in the connecting unit. This can reduce the luminance variations among the luminescent elements due to the voltage reduction of the second electrode. The layers provided in the connecting unit can have an electrical resistance set higher than that of: the metal of the auxiliary wire; and of the ITO which the second electrode is made of. This allows the layers to act as electrical buffer layers against an overcurrent so as to achieve effective reduction in the overcurrent. Further, the luminescent unit forming process requires no scheme for n-doping the hole transport layer. This simplifies the manufacturing process.

Moreover, when the metal layer 80 and the hole transport layer 60, both of which are provided in the connecting unit, are formed, the use of the layers included in the luminescent unit eliminates the needs of a patterning scheme in which the high-definition mask is used. This makes possible: simplifying the manufacturing process; and establishing advantages in enlarging a screen, and achieving high-definition.

Figure 2:
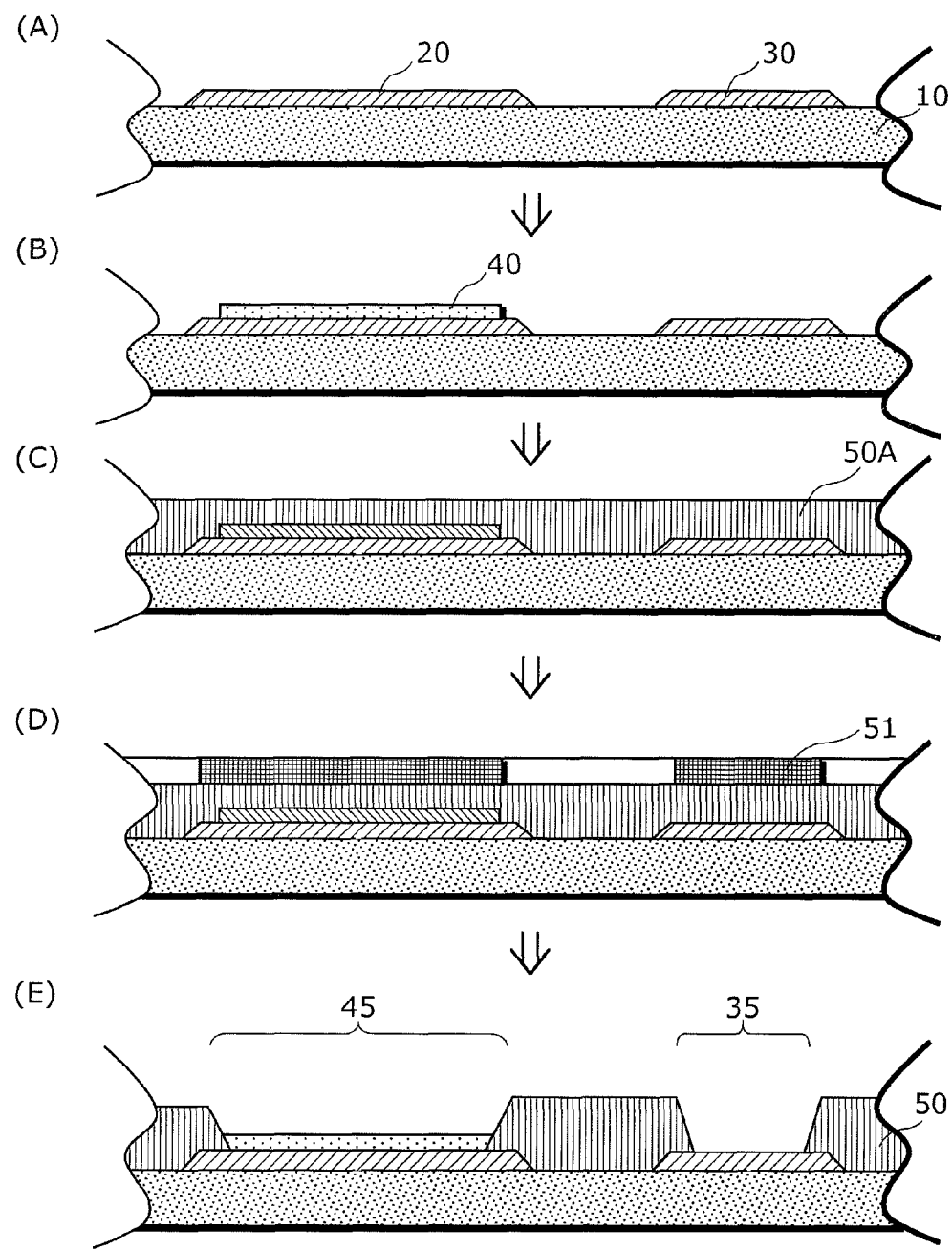
FIG. 2 is a cross-sectional view illustrating a manufacturing method of the organic EL display device in accordance with Embodiment 1 of the present invention.
Figure 3:
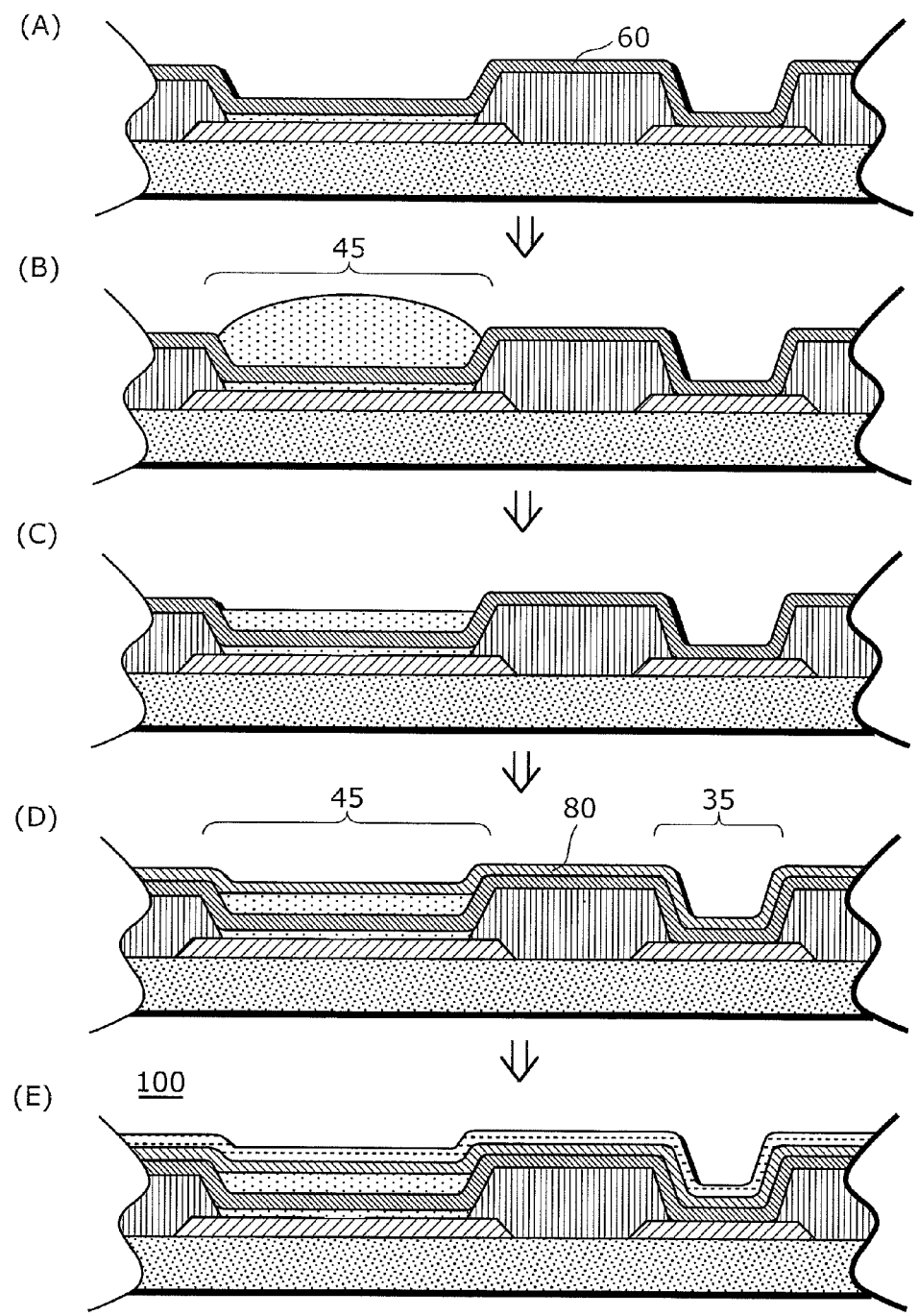
FIG. 3 is a cross-sectional view illustrating a manufacturing method of the organic EL display device in accordance with Embodiment 1 of the present invention.

Described hereinafter in detail is the manufacturing method of the organic EL display device in accordance with Embodiment 1 of the present FIGS. 2 and 3 are cross-sectional views illustrating the manufacturing method of the organic EL display device in accordance with Embodiment 1 of the present invention.

First, as shown in FIG. 2 (A), aluminum (Al) is laid over the entire substrate 10, using either the vacuum evaporation technique or the sputtering technique, for example. Here, the substrate 10 has a driving circuit (not shown) including a Thin Film Transistor (TFT) and a capacitor, for example. Then, the Al is etched using the photolithography technique. Hence formed are: the first electrode 20 at a predetermined position; and the auxiliary wire 30 at a position which is electrically insulated from the first electrode 20. Here, each first electrode 20 is individually formed per a corresponding one of the luminescent units, and each auxiliary wire 30 is formed with one-dimensionally placed along with, for example, either a column or a row of the luminescent pixels arranged in a two-dimensional matrix. It is noted, for example, that a planarizing layer may be provided on the substrate 10 as needed in order to remove the texture caused by the driving circuit, and the first electrode 20 and the auxiliary wire 30 may be formed on the planarizing layer.

Next, as shown in FIG. 2 (B), PEDOT is injected using, for example, the ink-jet technique, and the hole injection layer 40 is formed: on the first electrode 20; and at least in a position corresponding to a pixel opening part.

Then, as shown in FIG. 2 (C), negative photoresist 50A is applied to the entire surface.

Next, as shown in FIG. 2 (D), a mask 51 including a light-shielding part is aligned and stacked on the negative photoresist 50A. Here, the mask 51 lies over the positions where the luminescent unit and the connecting unit are provided. Through the mask 51, the negative photoresist 50A is exposed using the photolithography technique.

Then, as shown in FIG. 2 (E), the mask 51 is removed, and processing procedure is employed so as to form the barrier 50 providing the pixel opening part 45 and the connecting opening part 35.

Next, as shown in FIG. 3 (A), a hole-transporting organic filming material made into ink is injected in order to form the hole transport layer 60 over the entire surface. Then, the hole transport layer 60 is vacuum-dried, and then heated in a nitrogen atmosphere to cause a cross-linking reaction. Here, the hole transport layer 60 is made of an organic material with no n-doped.

Next, as shown in FIG. 3 (B), a paste material to be the luminescent layer is applied in the pixel opening part 45 via, for example, the ink-jet technique. When placed, the paste material rises due to the surface tension.

Then, as shown in FIG. 3 (C), the paste material is, for example, dried approximately for 30 minutes at 80 degree Celsius in order to volatilize a solvent component in the paste material. Hence, the luminescent layer 70 is formed. In the case where the luminescent unit includes different sub-pixels representing, such as at least three "R", "G", and "B", the repetition of the processes, shown in FIGS. 3 (B) and (C) for each sub-pixel, forms a luminescent layer included in a luminescent unit which differs from sub-pixel to sub-pixel.

Next, as shown in FIG. 3 (D), the metal layer 80 is formed over the entire surface, using for example vacuum evaporation technique, so as to coat at least pixel opening part 45 and the connecting opening part 35. The formation of the metal layer 80 forms the connecting unit structured in the lamination of the hole transport layer 60 and the metal layer 80.

The work function of the metal atoms included in the metal layer 80 is approximately as great as, or smaller than, the absolute value of the energy level of the lowest unoccupied molecular orbit of the hole transport layer 60. In the connecting unit provided over the auxiliary wire 30, the electrons can be easily supplied from the metal atoms to the hole transport layer 60. Hence, the hole transport layer 60, which is not n-doped in the luminescent unit lying over the first electrode 20, is n-doped in the connecting unit.

Then, as shown in FIG. 3 (E), ITO for example is applied on the metal layer 80 with a use of the sputtering technique, and the second electrode 90 is formed over the entire surface. The formation of the second electrode 90 electrically connects the second electrode 90 and the auxiliary wire 30 via the laminated structure of the hole transport layer 60 and the metal layer 80.

Then, a protecting layer, such as a resin layer and glass, is formed, and the organic EL display device 100 is finalized.

According to the manufacturing method of the organic EL display device in accordance with Embodiment 1, the auxiliary wire and the second electrode are connected via the laminated structure of the hole transport layer and the metal layer included in the connecting unit. Hence, the electron transport layer reduces the characteristics decrease of the driving circuit and the luminescent unit caused by the overcurrent, which makes possible manufacturing an organic EL display device with high-reliability such as a long life-time.

Preferably, the processes of forming (i) the metal layer 80 shown in FIG. 3 (D) and (ii) the second electrode 90 shown in FIG. 3 (E) are successive dry processes. Here the successive dry processes involve moving the goods-in-process under a high degree of vacuum between the film-forming processes in which the sputtering technique and the vapor deposition technique are employed. The manufacturing process can be simplified by introducing the above successive dry processes as a series of processes from the process of forming the metal layer 80 to the process of forming the second electrode 90. In addition, the successive dry processes reduce the deposition of an unnecessary oxide layer on the interface found between the metal layer 80 and the second electrode 90, which contributes to high light-emission efficiency, low driving voltage, and long life-time of the organic EL display device.

Further, according to Embodiment 1, at least the luminescent layer, the hole transport layer, the metal layer, and the second electrode can be basically formed with no high-definition mask intercalated. As a result, the organic EL display device can be efficiently manufactured with high productivity.

It is noted in Embodiment 1 that the luminescent unit is exemplified to include, though shall not limited to, the hole injection layer, the hole transport layer, the luminescent layer, and the metal layer. For example, the luminescent unit may be formed in any structure as far as at least the hole transport layer and the metal layer are included other than the luminescent layer. Corresponding to the structure of the luminescent unit, the connecting unit intercalated between the second electrode and the auxiliary wire may include at least one of the electron injection layer, the electron transport layer, and the hole injection layer other than the hole transport layer and the metal layer.

Here, the connecting unit is preferably formed so that a current flowing from the second electrode to the auxiliary wire has no opposite direction diode characteristics.

In the case where the connecting unit is structured, for example, in the lamination of the hole injection layer and the electron transport layer, however, the current flowing from the second electrode to the auxiliary wire possibly has the opposite direction diode characteristics. Even in this case, an avalanche current flows from the second electrode to the auxiliary wire in the case where the reverse pressure of the opposite direction diode characteristics of the laminated structure is lower than a voltage applied to the connecting unit. Thus, the organic EL display device having the above laminated structure is also included in an implementation of the present invention, and has an effect similar to that of the organic EL display device 100, in accordance with Embodiment 1, illustrated in FIG. 1.

Concurrently, in the case where the reverse pressure of the opposite direction diode characteristics of the laminated structure is greater than the voltage applied to the connecting unit, a current path leading from the second electrode to the auxiliary wire is disconnected. Accordingly, a current path used for luminescent is disconnected, as well. Such a laminated structure is not applicable to an implementation of the present invention.

In other words, any given combination is possible as far as the layer structure (i) includes the hole transport layer 60 and the metal layer 80, and (ii) does not stop the flow of the current in the connecting unit with respect to the current flowing in the luminescent unit.

Here, the electron injection layer is chiefly made of an electron-injecting material. The electron-injecting material is capable of injecting the electrons, having been injected from the second electrode 90 side, to the luminescent layer 70 either in a stable manner, or assisting the generation of the electrons.

In addition, the electron transport layer is chiefly made of an electron-transporting material. The electron-transporting material: tends to (i) be anionic due to its electron acceptability, and (ii) have characteristics to transmit the generated electrons via the charge transfer reaction between the molecules; and is suitable for transmission of the charge from the second electrode 90 to the luminescent layer 70.

In Embodiment 1, exemplified, though not shall be limited to this, is the organic EL display device having the barrier. In FIG. 2 (E), for example, the luminescent layer may be provided only in the pixel opening part by laying a layer repelling the paste material of the luminescent layer in a region other than the hole transport layer 60 and the pixel opening part 45. This eliminates the need for the forming process of the barrier, which can further improve productivity.

It is noted in Embodiment 1 that each auxiliary wire is placed per luminescent pixel column; concurrently, the arrangement shall not be limited to this.

Figure 4:
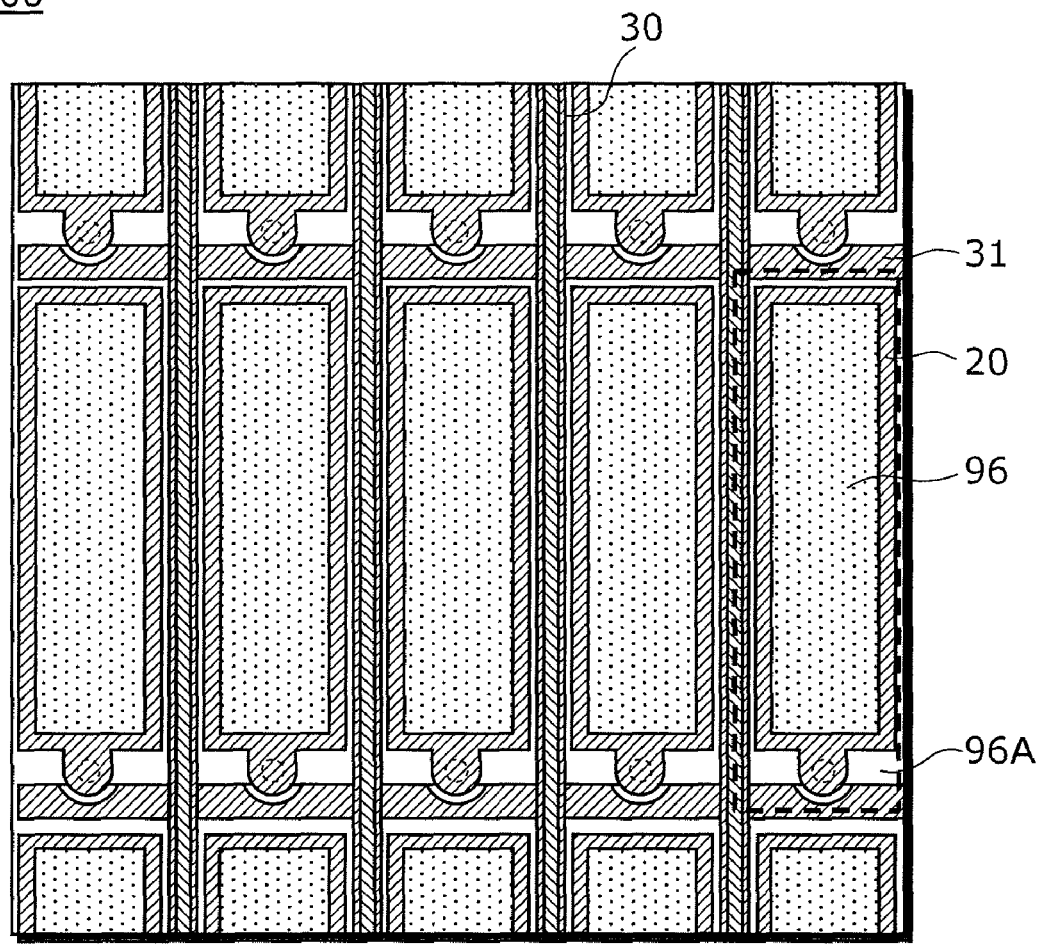
FIG. 4 is a partial plan view illustrating the main section of the organic EL display device of Modification 1 in accordance with Embodiment 1 of the present invention.

FIG. 4 is a partial plan view illustrating a main section of the organic EL display device of Modification 1 in accordance with Embodiment 1 of the present invention. As an organic EL display device 200 shown in FIG. 4, luminescent pixels 96A each including a luminescent unit 96 may be arranged in a matrix, and each auxiliary wire 30 and auxiliary wire 31 may be two-dimensionally placed along with a corresponding luminescent pixel column and a corresponding luminescent pixel column row, respectively. This arrangement makes possible enlarging the connection area shared by (i) the auxiliary wires 30 and 31 and (ii) the second electrode 90, reducing current density, and improving a buffer effect on an overcurrent. In addition, the arrangement can reduce wiring resistance which depends on the distance between the second electrode and the auxiliary wire, and thus reduce driving voltage variations due to the location of the luminescent unit. As a result, an organic EL display device having higher displaying quality can be realized.

Figure 5:
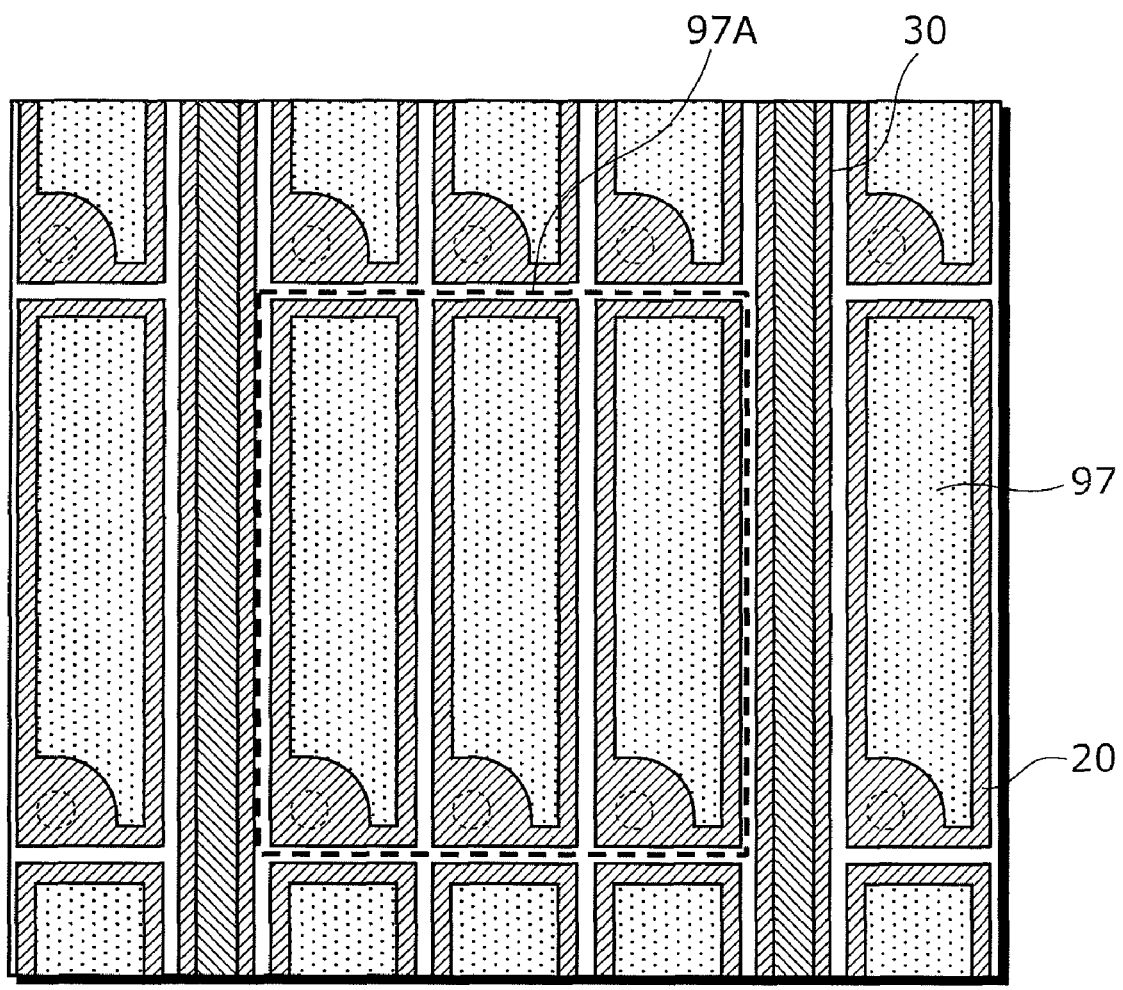
FIG. 5 is a partial plan view illustrating the main section of the organic EL display device of Modification 2 in accordance with Embodiment 1 of the present invention.

FIG. 5 is a partial plan view illustrating a main section of the organic EL display device of Modification 2 in accordance with Embodiment 1 of the present invention. An organic EL display device 230 shown in FIG. 5 includes a luminescent pixel 97A having a luminescent unit 97. Here, the luminescent unit 97A has at least three sub-pixels representing "R", "G", and "B". As in this case, for each luminescent pixel including three sub-pixels, each auxiliary wire 30 may be placed along with the luminescent pixel per luminescent pixel column.

This structure makes possible enlarging an opening area of the sub-pixel, and thus achieving an organic EL display device having high display luminance. In addition, the enlarged area of the auxiliary wire 30 can further reduce the density of currents flowing into the auxiliary wire to improve reliability, and relax accuracy in aligning the mask. This makes possible improving the productivity.

Figure 6:
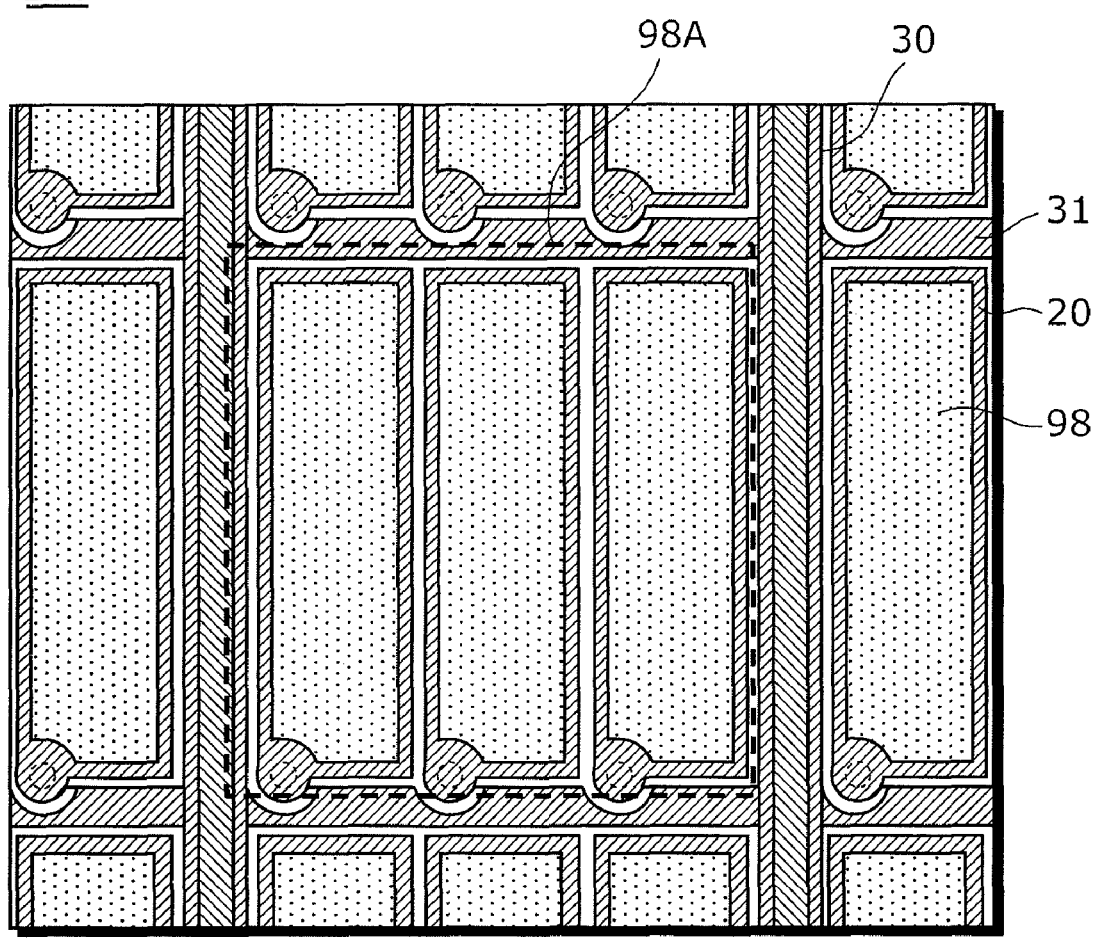
FIG. 6 is a partial plan view illustrating the main section of the organic EL display device of Modification 3 in accordance with Embodiment 1 of the present invention.

FIG. 6 is a partial plan view illustrating a main section of the organic EL display device of Modification 3 in accordance with Embodiment 1 of the present invention. An organic EL display device 260 shown in FIG. 6 includes a luminescent pixel 98A having a luminescent unit 98. Here, the luminescent unit 98A has at least three sub-pixels representing "R", "G", and "B". As this structure shows, for each luminescent pixel including the three sub-pixels, the auxiliary wire 30 and the auxiliary wire 31 may be arranged two dimensionally such that (i) the auxiliary wire 30 is placed along with per luminescent column, and (ii) the auxiliary wire 31 is placed along with per luminescent row.

Since this structure can reduce the wiring resistance which: is observed in the sub-pixel placed in the middle of the three sub-pixels; and depends on the distance between the second electrode and the auxiliary wire, the luminance variations among the sub-pixels can further be reduced.

Embodiment 2

Described hereinafter shall be an organic EL display device in accordance with Embodiment 2 of the present invention with reference to the drawings.

Figure 7:
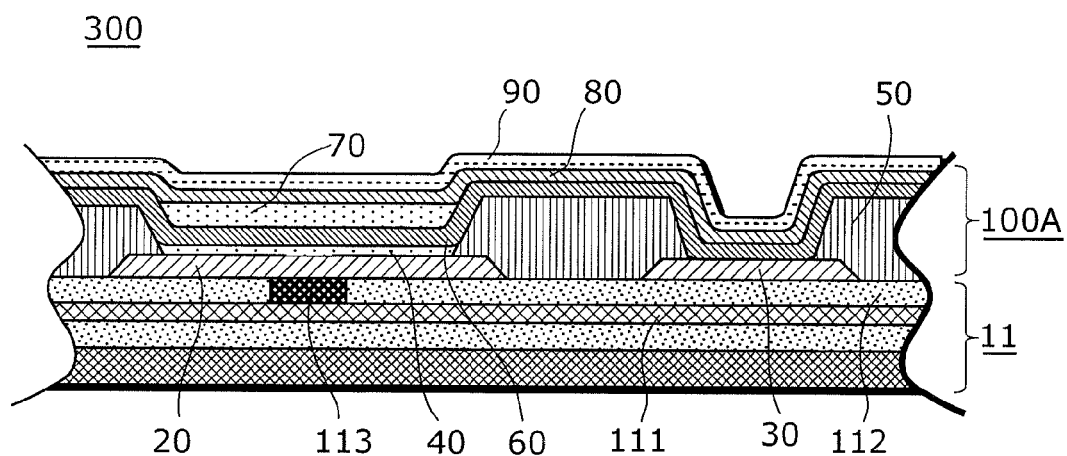
FIG. 7 is a partial plan view illustrating a main section of an organic EL display device in accordance with Embodiment 2 of the present invention.

FIG. 7 is a partial plan view illustrating a main section of an organic EL display device in accordance with Embodiment 2 of the present invention. As shown in FIG. 7, an organic EL display device 300 includes a substrate 11 and a displaying unit 100A. The substrate 11 includes a driving circuit layer 111 forming a driving element driving a luminescent unit, and an interlayer insulating layer 112 formed on the driving circuit layer 111. In addition, the displaying unit 100A corresponds to the structural elements of the organic EL display device 100 illustrated in FIG. 1B other than the substrate 10. The organic EL display device 300 in accordance with Embodiment 2 is different from the organic EL display device 100 in accordance with Embodiment 1 in substrate structure. Described hereinafter are only the differences between the organic EL display device 300 in Embodiment 2 and the organic EL display device 100 in Embodiment 1, and thus identical points therebetween shall be omitted.

The driving circuit layer 111 includes a driving element (not shown) having a field-effect transistor (FET), such as a TFT. The TFT included in the driving element typically has a gate electrode, a source electrode, and a drain electrode. Here, the source electrode and the drain electrode are placed across an insulating film. Details of the TFT shall be omitted.

Further, the interlayer insulating layer 112 is formed on the driving circuit layer 111. Through a conductive via 113 formed in the interlayer insulating layer 112, an electrode terminal (not shown) of the driving circuit and the first electrode 20 are connected.

The displaying unit 100A is formed on the interlayer insulating layer 112.

Figure 8:
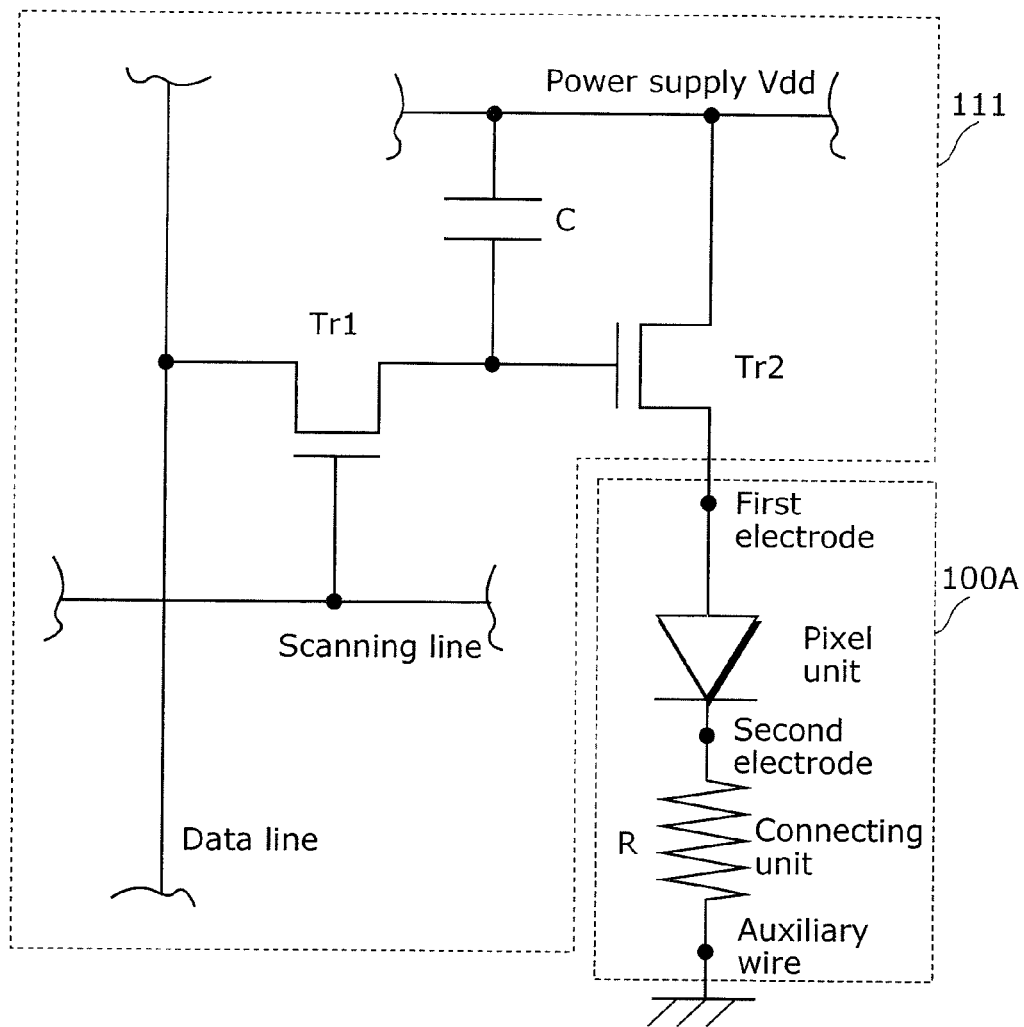
FIG. 8 is a main circuit diagram in the organic EL display device in accordance with Embodiment 2 of the present invention.

Described hereinafter is the driving circuit layer 111 driving the luminescent unit with reference to the drawings. FIG. 8 is a main circuit diagram in the organic EL display device in accordance with Embodiment 2 of the present invention. As shown in FIG. 8, the driving circuit layer 111 includes a switching transistor Tr1 having Nch-FET used as a driving element, and a driving transistor Tr2 having Pch-FET, and a capacitor C. The drain electrode and the gate electrode of Tr1 are respectively connected to a data line and a scan line. The source electrode of the Tr1 is connected to the capacitor C and the gate electrode of the Tr2. The source electrode and the drain electrode of Tr2 are respectively connected to a power supply Vdd and the first electrode 20 of the luminescent unit.

According to this structure, when a selecting signal enters into the scan line and Tr1 opens, a data signal supplied through the data line is written in the capacitor C as a voltage value. Then the holding voltage written in the capacitor C is held for one frame period. This holding voltage causes an analogue change of the conductance of the Tr2, and thus a forward bias current corresponding to a luminescent gradation is supplied. Further, the forward bias current supplied to the first electrode flows through the auxiliary wire via the luminescent unit, the second electrode, and the connecting unit which includes, for example, a laminate of the hole transport layer and the metal layer. This structure allows the luminescent layer of the luminescent unit to emit light according to the flowing current, and an image is displayed.

In addition, Embodiment 2 involves connecting, to the first electrode, the drain electrode of the driving element included in the driving circuit in order for the current to flow into to the auxiliary wire.

This structure makes possible: realizing, in a simple structure, the active-matrix organic EL display device 300 integrating the driving circuit layer 111; and significantly reducing luminance variations among pixels, as well as blocking the flow of the overcurrnt into the pixels.

It is noted that FIG. 8 exemplifies a main circuit structure of the organic EL display device. As a matter of course, another circuit structure may be applied to an implementation of the present invention, accordingly. For example, a similar effect may be observed in a circuit structure having the first electrode connected to the source electrode of the driving element.

Embodiment 3

Described hereinafter shall be an organic EL display device in accordance with Embodiment 3 of the present invention with reference to the drawings.

Figure 9A:
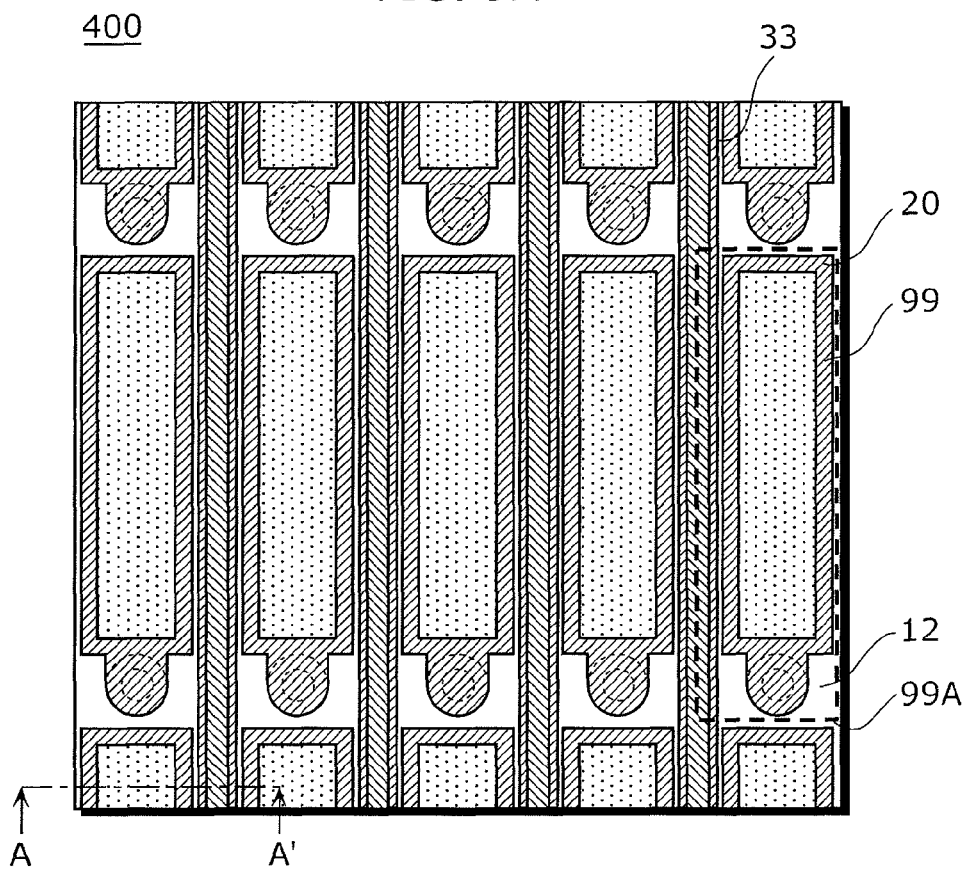
FIG. 9A is a partial plan view illustrating a main section of an organic EL display device in accordance with Embodiment 3 of the present invention.
Figure 9B:
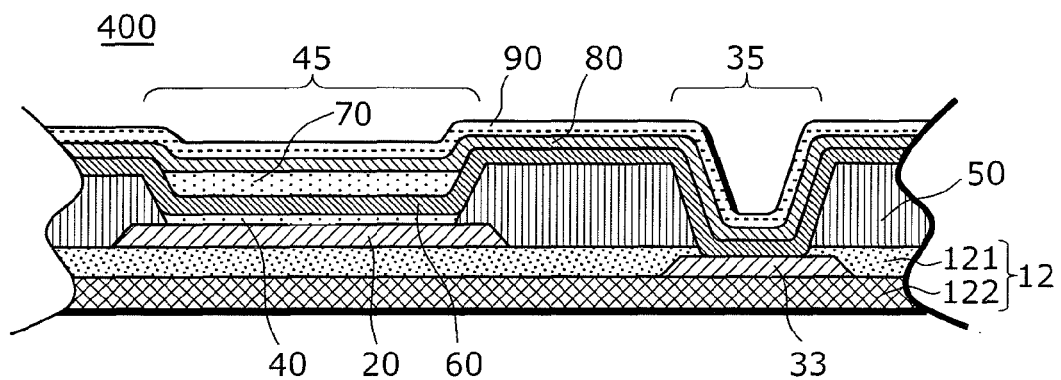
FIG. 9B is a cross-sectional view, of the main section, taken from line IXA-IXA of FIG. 9A.

FIG. 9A is a partial plan view illustrating a main section of the organic EL display device in accordance with Embodiment 3 of the present invention. FIG. 9B is a cross-sectional view, of the main section, taken from line IXA-IXA of FIG. 9A.

As shown in FIG. 9B, the organic EL display device 400 in accordance with Embodiment 3 includes: a substrate 12; the first electrode 20 provided on the substrate 12; an auxiliary wire 33 provided in the substrate 12; the hole injection layer 40 provided on the first electrode 20; the barrier 50 forming the pixel opening part 45 and the connecting opening part 35; the hole transport layer 60 provided over the substrate 12, the first electrode 20, the auxiliary wire 33, the hole injection layer 40, and the barrier 50; the luminescent layer 70 provided in the pixel opening part 45; the metal layer 80 provided over the hole transport layer 60 and the luminescent layer 70; and the second electrode 90 provided on the metal layer 80.

The substrate 12 is made up of plural layers and includes a first layer 121 which is the top layer of the substrate 12, and a second layer 122. The first electrode 20 is formed on the first layer 121. The auxiliary wire 33 is formed on the second layer 122.

Compared with the organic EL display device 100 in accordance with Embodiment 1, the organic EL display device 400 in accordance with Embodiment 3 is different in the following: the substrate 12 includes the plurality of layers; the first electrode 20 is provided on the top layer of the substrate 12; and the auxiliary wire 33 is formed in a layer which is different from the top layer.

As shown in FIG. 9A, the organic EL display device 400 has luminescent pixels 99A, each including a luminescent unit 99, arranged in a matrix. Each of auxiliary wires 33 is placed per luminescent pixel column along with a corresponding one of the luminescent units 99. It is noted that the hole transport layer 60, the metal layer 80, and the second electrode 90 are formed entirely over the partial plan view shown in FIG. 9A. The auxiliary wire 33 and the second electrode 90 are electrically connected each other via a connecting unit in the connecting opening part 35 provided along with the auxiliary wire 33, the connecting unit which includes the hole transport layer 60 and the metal layer 80.

It is noted as a layer structure, between the second electrode 90 and auxiliary wire 30, observed in the connecting opening part 35 that the layer structure shall not be limited to the above as far as the layer structure (i) includes a layer other than the hole transport layer 60 and the metal layer 80, and (ii) does not hinder a flow of a current with respect to the flow of the current. An organic EL display device in this structured laminate is also included in the present invention, and has an effect similar to that of the organic EL display device 400, in accordance with Embodiment 3, illustrated in FIGS. 9A and 9B.

In addition, the luminescent unit 99: includes at least the luminescent layer 70, the hole transport layer 60, and the metal layer 80 all of which are provided in the pixel opening part 45; and releases, at the second electrode 90 side, light generated by recombination of electrons and holes both injected into the luminescent layer 70. It is noted that each of first electrodes 20 corresponds to an associated one of the luminescent units 99, and is separately provided per pixel. In other words, in the case where the luminescent unit includes at least three sub-pixels representing "R", "G", and "B", the luminescent unit 99 and the first electrode 20 correspond to an associated one of the sub-pixels. The luminescent unit 99 and the first electrode 20 both corresponding to one of the associated sub-pixels are separated from the other luminescent unit 95 and the other first electrode 20 both corresponding to another one of associated sub-pixels.

It is noted that the material of each structural element included in the organic EL display device 400, such as the substrate 12 and the luminescent layer 70, is similar to that described in Embodiment 1, and thus description thereof shall be omitted.

In Embodiment 3, providing the auxiliary wire and the first electrode to respective layers each having a different substrate makes possible forming the auxiliary wire and the first electrode overlapped, for example. This structure can significantly enlarge the area of the auxiliary wire. Accordingly, the enlarged area of the auxiliary wire allows the area of the connecting opening part 35 to be enlarged. As a result, there enlarged are (i) a connecting area shared between the second electrode and the connecting unit which includes the hole transport layer and the metal layer, and (ii) a connecting area shared between the auxiliary wire and the connecting unit, and thus an overcurrent can be effectively reduced. Further, Embodiment 3 allows the first electrode and the auxiliary wire to be sterically arranged, which makes possible significantly easing the restriction of a form and a size of a wiring electrode. In the above structure, the auxiliary wire can be formed across the substrate as far as the conductive via and the auxiliary wire do not electrically short-circuit for example, the conductive via which is connected to an electrode terminal of the driving element formed on the substrate.

Similar to Embodiment 1, Embodiment 3 may have each auxiliary wire placed either one-dimensionally or two-dimensionally at least one of per luminescent pixel row and per luminescent pixel column.

Embodiment 3 can have the auxiliary wire and the first electrode sterically arranged, which can enlarge the area of the first electrode. This arrangement makes possible significantly enlarging the opening area of the luminescent unit. The enlarged opening area allows the luminescent unit to emit light with a low driving voltage and a small driving current, which makes possible realizing an organic EL display device with a long life-time and high-reliability.

Further, Embodiment 3 can have each of the first electrode and the auxiliary wire formed out of a different material such that the material of the auxiliary wire is decided based on a required resistivity, and the material of the first electrode is decided based on the structure of the luminescent unit. Thus, most suitable materials are used in Embodiment 3, which increases the range of options for the materials. In the case of the bottom-emission technique, for example, the first electrode may be formed out of a transparent conductive material, and the auxiliary wire may be formed out of a metallic material.

Described hereinafter in detail shall be a manufacturing method of the organic EL display device in accordance with the present invention with reference to the drawings.

Figure 10:
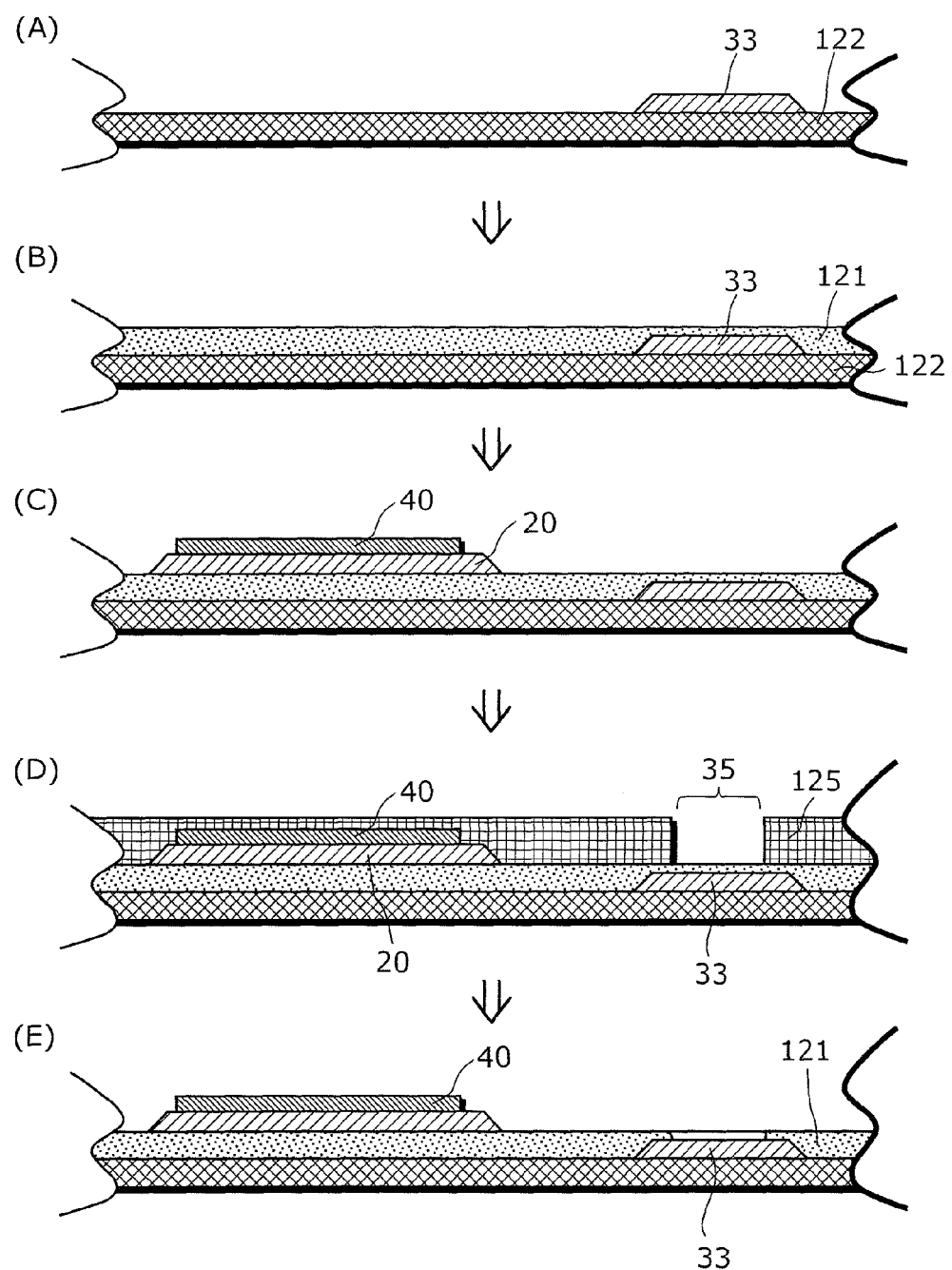
FIG. 10 is a cross-sectional view illustrating a manufacturing method of the organic EL display device in accordance with Embodiment 3 of the present invention.
Figure 11:
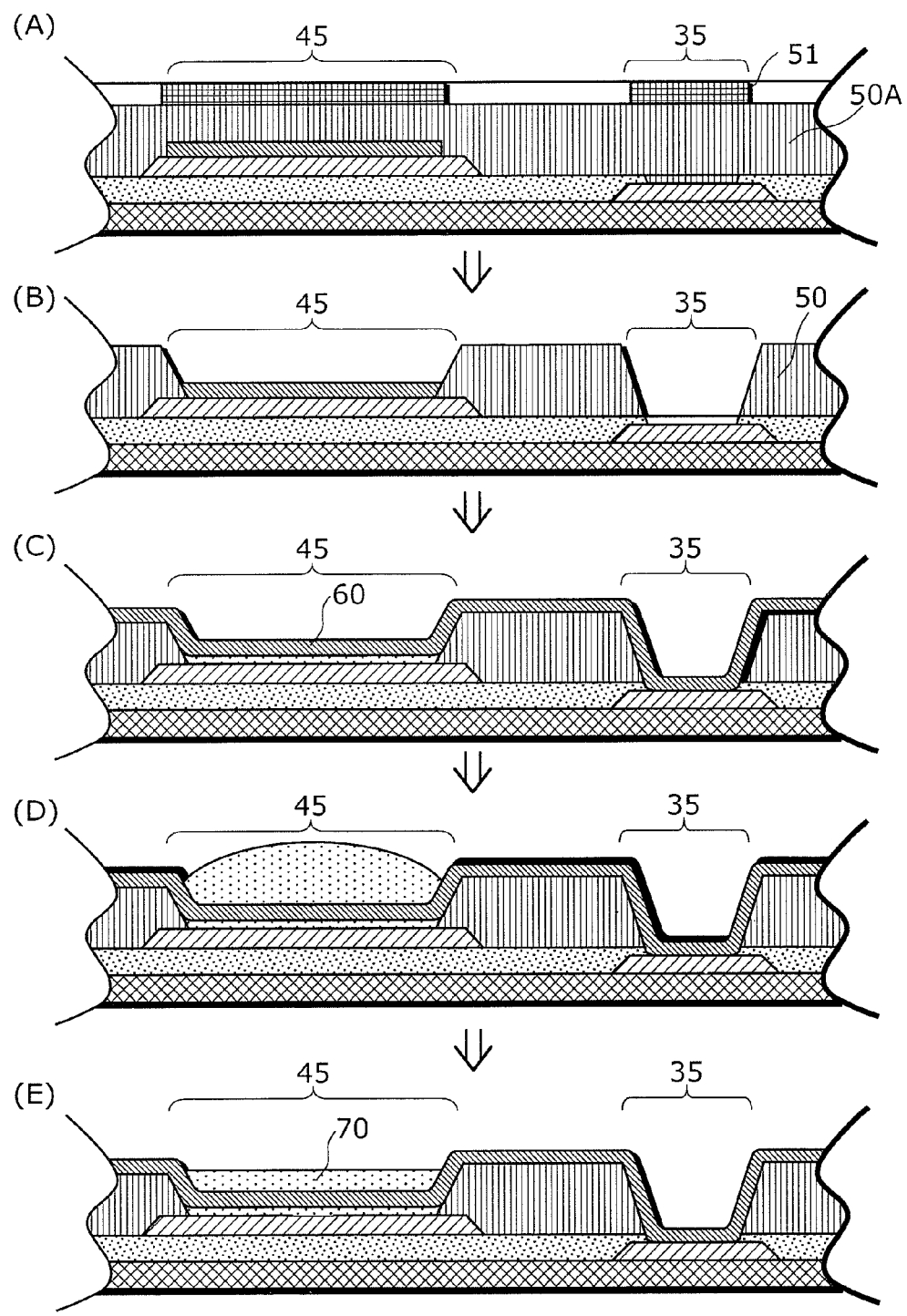
FIG. 11 is a cross-sectional view illustrating the manufacturing method of the organic EL display device in accordance with Embodiment 3 of the present invention.
Figure 12:
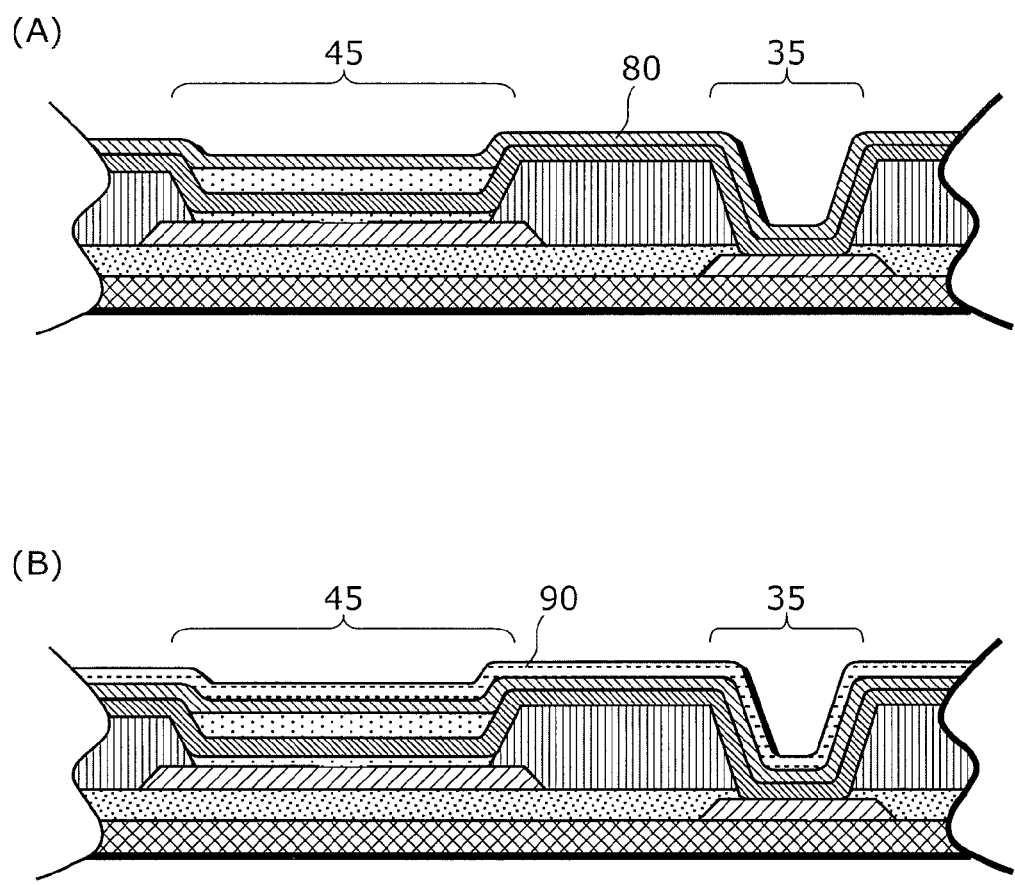
FIG. 12 is a cross-sectional view illustrating the manufacturing method of the organic EL display device in accordance with Embodiment 3 of the present invention.

FIGS. 10 to 12 are cross-sectional views illustrating the manufacturing method of the organic EL display device in accordance with Embodiment 3 of the present invention.

First, as shown in FIG. 10(A), Al is laid entirely over the second layer 122, using either the vacuum evaporation technique or the sputtering technique, for example. Here, the second layer 122 is a lower layer of the substrate 12 including a plurality of layers. Then, the Al is etched using the photolithography technique, and the auxiliary wire 33 is formed at a predetermined position. Here, each of auxiliary wires 33 is formed with either one-dimensionally or two-dimensionally placed. The placed auxiliary wires 33 are positioned along with, for example, either a column or a row of the luminescent units arranged in a two-dimensional matrix. In the case of the top-emission technique, in particular, the auxiliary wire may be formed at any given position as far as the auxiliary wire does not short-circuit with the driving circuit driving each luminescent unit.

Next, as shown in FIG. 10 (B), the first layer 121 is formed out of an oxide film such as silicon, using the Chemical Vapor Deposition (CVD) technique and the sputtering technique, the first layer 121 which is a top layer of the substrate. Preferably, the surface of the first layer 121 is planarized by, for example, the Chemical Mechanical Polishing (CMP) technique.

Then, as shown in FIG. 10 (C), Al is laid entirely over the first layer 121, using for example the vacuum evaporation technique and the sputtering technique. Then, the Al is etched using the photolithography technique, and the first electrode 20 is formed at a predetermined position. Following the formation of the first electrode 20, PEDOT is injected using, for example, the ink-jet technique, and the hole injection layer 40 is formed on the first electrode 20 and in a pixel opening part.

Next, as shown in FIG. 10 (D), a resist film 125 is formed. Here, the resist film 125 has an opening part whose position is: different from the position of the first electrode 20; and defined as the position of the connecting opening part 35 formed along with the auxiliary wire 33.

Then, as shown in FIG. 10 (E), the first layer 121 is etched via the opening part of the resist film 125. This etching exposes the auxiliary wire 33.

Then, as shown in FIG. 11 (A), the negative photoresist 50A is applied to the entire surface. Next, the mask 51 including a light-shielding part is aligned and stacked on the negative photoresist 50A. Here, the mask 51 lies over the positions where pixel opening part 45 and connecting opening part 35 are provided. Through the mask 51, the negative photoresist 50A is exposed using the photolithography technique.

Then, as shown in FIG. 11 (B), the mask 51 is removed, and curing treatment is employed so as to form the barrier 50 providing the pixel opening part 45 and the connecting opening part 35.

Next, as shown in FIG. 11 (C), a hole-transporting organic filming material made into ink is injected in order to form the hole transport layer 60 over the entire surface. Then, the hole transport layer 60 is vacuum-dried, and then heated in a nitrogen atmosphere to cause a cross-linking reaction. Here, the hole transport layer 60 is made of an organic material with no n-doped.

Next, as shown in FIG. 11 (D), a paste material to be the luminescent layer is placed in the pixel opening part 45 via, for example, the ink-jet technique. When placed, the paste material rises due to the surface tension.

Then, as shown in FIG. 11 (E), the paste material is, for example, dried approximately for 30 minutes at 80 degree Celsius in order to volatilize a solvent component in the paste material. Hence, the luminescent layer 70 is formed in the luminescent unit. In the case where the luminescent unit includes different sub-pixels representing, such as at least three "R", "G", and "B", the repetition of the processes, shown in FIGS. 11 (D) and (E) for each sub-pixel, forms a pixel having a luminescent layer included in a luminescent unit which differs from sub-pixel to sub-pixel.

Next, as shown in FIG. 12 (A), the metal layer 80 is formed over the entire surface, using for example vacuum evaporation technique, so as to coat at least pixel opening part 45 and the connecting opening part 35. The formation of the metal layer 80 forms the connecting unit structured in the lamination of the hole transport layer 60 and the metal layer 80.

The work function of the metal atoms included in the metal layer 80 is approximately as great as, or smaller than, the absolute value of the energy level of the lowest unoccupied molecular orbit of the hole transport layer 60. In the connecting unit provided over the auxiliary wire 33, the electrons can be easily supplied from the metal atoms to the hole transport layer 60. Hence, the hole transport layer 60, which is not n-doped in the luminescent unit lying over the first electrode 20, is n-doped in the connecting unit.

Then, as shown in FIG. 12 (B), ITO for example is applied on the metal layer 80 with a use of the sputtering technique, and the second electrode 90 is formed over the entire surface. The formation of the second electrode 90 electrically connects the second electrode 90 and the auxiliary wire 30 via the laminated structure of the hole transport layer 60 and the metal layer 80.

Then, similar to Embodiment 1, a protecting layer, such as a resin layer and glass, is formed, and the organic EL display device 400 is finalized.

The use of the manufacturing method of the organic EL display device in accordance with Embodiment 3 can provide an effect similar to that described in Embodiment 1.

According to the manufacturing method of the organic EL display device in accordance with Embodiment 3, providing each of the auxiliary wire and the first electrode in a different layer of the substrate makes possible further enlarging the connection area shared by the second electrode and the auxiliary wire. The use of the manufacturing method can reduce current density, further improve a buffer effect on an overcurrent, and thus reduce driving voltage variations. The resulting organic EL display device to be manufactured has few luminance variations, high-display quality, and high-productivity.

In addition, the manufacturing method in accordance with Embodiment 3 allows the auxiliary wire and the first electrode to be sterically arranged, which makes possible enlarging the area of the first electrode. Thus, the opening area of the luminescent unit can be significantly enlarged. The enlarged opening area allows the luminescent unit to emit light with a low driving voltage and a small driving current, which makes possible realizing an organic EL display device with a long life-time and high-reliability.

Moreover, the manufacturing method in accordance with Embodiment 3 can have each of the first electrode and the auxiliary wire formed out of a different material such that the material of the auxiliary wire is decided based on a required resistivity, and the material of the first electrode is decided based on the structure of the luminescent unit. Thus, any given most suitable materials can be chosen. As a result, an organic EL display device made of materials out of a wider range of materials can be easily manufactured.

Preferably, the processes of forming (i) the metal layer 80 shown in FIG. 12 (A) and (ii) the second electrode 90 shown in FIG. 12 (B) are successive dry processes. The manufacturing process can be simplified by introducing the above successive dry processes as a series of processes from the process of forming the metal layer 80 to the process of forming the second electrode 90. In addition, the successive dry processes reduce the deposition of an unnecessary oxide layer on the interface found between the metal layer 80 and the second electrode 90, which contributes to high light-emission efficiency, low driving voltage, and long life-time of the organic EL display device.

It is noted in Embodiment 3 that the luminescent unit is exemplified to include, though shall not limited to, the hole injection layer, the hole transport layer, the luminescent layer, and the metal layer. For example, the luminescent unit may be formed in any structure as far as at least the hole transport layer and the metal layer are included other than the luminescent layer. Corresponding to the structure of the luminescent unit, the connecting unit intercalated between the second electrode and the auxiliary wire may include at least one of the electron injection layer, the electron transport layer, and the hole injection layer other than the hole transport layer and the metal layer.

Here, the connecting unit is preferably formed so that a current flowing from the second electrode to the auxiliary wire has no opposite direction diode characteristics.

In the case where the connecting unit is structured, for example, in the lamination of the hole injection layer and the electron transport layer, however, the current flowing from the second electrode to the auxiliary wire possibly has the opposite direction diode characteristics. Even in this case, an avalanche current flows from the second electrode to the auxiliary wire in the case where the reverse pressure of the opposite direction diode characteristics of the laminated structure is lower than a voltage applied to the connecting unit. An organic EL display device in the above structured laminate is also included in an implementation of the present invention, and has an effect similar to that of the organic EL display device 400, in accordance with Embodiment 3, illustrated in FIG. 12.

Concurrently, in the case where the reverse pressure of the opposite direction diode characteristics of the laminated structure is greater than the voltage applied to the connecting unit, a current path leading from the second electrode to the auxiliary wire is disconnected. Accordingly, a current path used for luminescent is disconnected, as well. Such a laminated structure is not applicable to an implementation of the present invention.

In other words, any given combination is possible as far as the laminated structure (i) includes the hole transport layer 60 and the metal layer 80, and (ii) does not stop the flow of the current in the connecting unit with respect to the current flowing in the luminescent unit.

In Embodiment 3, exemplified, though not shall be limited to this, is the organic EL display device having the barrier 50. In FIG. 11 (C), for example, the luminescent layer may be provided only in the pixel opening part by laying a layer repelling the paste material of the luminescent layer in a region other than the hole transport layer 60 and the pixel opening part 45. This eliminates the need for the forming process of the barrier, which can further improve productivity.

It is noted in Embodiment 3 that the auxiliary wires are arranged per luminescent pixel column; concurrently, the arrangement shall not be limited to this.

Embodiment 4

Described hereinafter shall be an organic EL display device in accordance with Embodiment 4 of the present invention with reference to the drawings.

Figure 13:
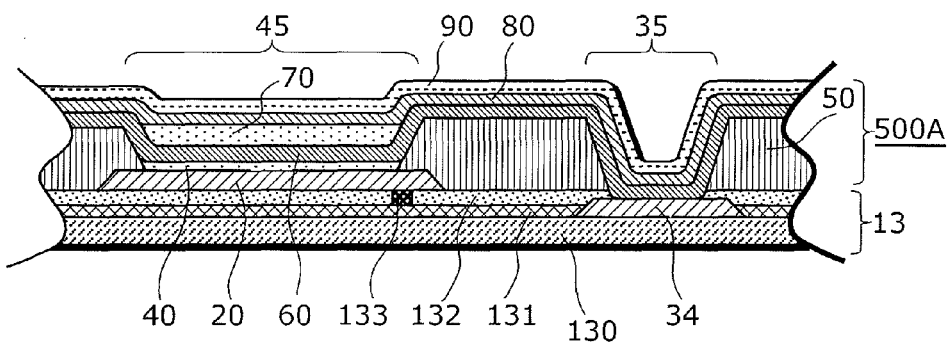
FIG. 13 is a partial plan view illustrating a main section of an organic EL display device in accordance with Embodiment 4 of the present invention.

FIG. 13 is a partial plan view illustrating a main section of an organic EL display device in accordance with Embodiment 4 of the present invention. As shown in FIG. 13, an organic EL display device 500 includes a substrate 13 and a displaying unit 500A. The substrate 13 includes a base layer 130, a driving circuit layer 131 forming a driving element driving a luminescent unit, and an interlayer insulating layer 132 formed on the driving circuit layer 131. In addition, the displaying unit 500A corresponds to the structure of the organic EL display device 400 illustrated in FIG. 1B other than the substrate 12. The organic EL display device 500 in accordance with Embodiment 4 is different from the organic EL display device 400 in accordance with Embodiment 1 in substrate structure. Described hereinafter are only the differences between the organic EL display device 500 in Embodiment 4 and the organic EL display device 400 in Embodiment 3, and thus identical points therebetween shall be omitted.

The first electrode 20 is formed on the interlayer insulating layer 132.

The auxiliary wire 34 is formed on the base layer 130.

The driving circuit layer 121 is formed on the base layer 130, and includes a driving element (not shown) having a field-effect transistor (FET), such as a TFT.

Further, the interlayer insulating layer 132 is formed on the driving circuit layer 131. Through a conductive via 133 formed in the interlayer insulating layer 132, an electrode terminal (not shown) of the driving circuit and the first electrode 20 are connected.

In this structure, the electrode terminal (not shown) of the driving circuit and the first electrode 20 are connected through the conductive via 133 formed in the interlayer insulating layer 132, and the second electrode 90 and the auxiliary wire 34 are connected via a connecting unit formed in the connecting opening part 35, the connecting unit which is structured in the lamination of the hole transport layer 60 and the metal layer 80.

A main circuit diagram of the organic EL display device 500 in accordance with Embodiment 4 is similar to that of the organic EL display device 300 in accordance with Embodiment 4 illustrated in FIG. 8.

Embodiment 4 makes possible realizing, in a simple structure, the active-matrix organic EL display device 500 integrating the driving circuit layer 131. Embodiment 4 also prevents an overcurrent from flowing into a pixel, curbs driving voltage variations of a luminescent unit, and reduces luminance variations observed in luminescent unit, which can realize an organic EL display device having high displaying quality.

Described above are the organic EL display devices according to an implementation of the present invention and the manufacturing methods thereof with reference to Embodiments; however, the organic EL display devices shall not be limited to above described Embodiments. Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, there is an organic EL display device having effects similar to those described in Embodiments 1 to 4. The organic EL display device may have the cross section structure of the organic EL display device 400 in accordance with Embodiment 3, and the planar layouts of the auxiliary wires 30 and 31 employed in the organic EL display devices introduced in Modifications 1 to 3 in accordance with Embodiment 1.

Figure 14:
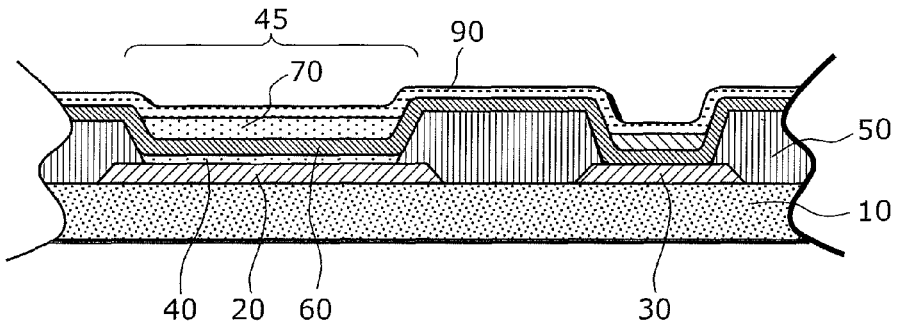
FIG. 14 is a cross-sectional view illustrating a main section of the organic EL display device of Modification 4 in accordance with Embodiment 1 of the present invention.

It is noted in Embodiments 1 to 4 that the layers included in the connecting unit have been described as a part of the layers included in the luminescent unit; concurrently, each layer included in the connecting unit and the luminescent unit is not necessarily formed in a single layer. FIG. 14 is a cross-section view illustrating a main section of the organic EL display device of Modification 4 in accordance with Embodiment 1 of the present invention. Compared with the organic EL display device 100 illustrated in FIG. 1B, an organic EL display device 600 shown in FIG. 14 is different in the point that the metal layer 80 is formed only in the connecting unit.

In Modification 4 in accordance with Embodiment 1 of the present invention, the metal layer 80 is required in order to supply electrons only to the hole transport layer 60 provided in the connecting unit, not to the layers included in the luminescent unit. In this case, a mask process is required in forming the metal layer 80, so that the metal layer 80 is: formed only in the connecting unit; or not formed in the luminescent unit. The manufacturing process in this case is not as easy as that employed in Embodiments 1 to 4; however, a use of at least an n-doped hole-transporting material as the connecting unit can achieve the objects of the present invention such as prevention of an overcurrent from flowing into a pixel and reduction of luminance variations.

In the case where Embodiments 1 to 4 have a structure such that the hole transport layer 60 included in the luminescent unit is separated from the hole transport layer 60 included in the connecting unit, the structure has an effect similar to that obtained by the organic EL display device in above described Modification 4 in accordance with Embodiment 1.

Further, Embodiments 1 to 4 have a structure of the second electrode 90 formed in contact with the metal layer 80; concurrently, an electron-transporting layer may be formed between the metal layer 80 and the second electrode 90. For example, the electron-transporting layer is formed in the manufacturing process below. First, barium of 5 nm (having a purity of 99% or higher, manufactured by Aldrich Co.) is deposited as the metal layer 80, using the vacuum evaporation technique. Then, an organic compound Alq of 20 nm, including barium of 20% (having a purity of 99% or higher, manufactured by Nippon Steel Chemical Co., Ltd.), is deposited in film, using the co-evaporation technique. Finally, an ITO electrode of 100 nm is formed as the second electrode 90, using a plasma coating apparatus manufactured by Sumitomo Heavy Industries, Ltd.

Figure 15:
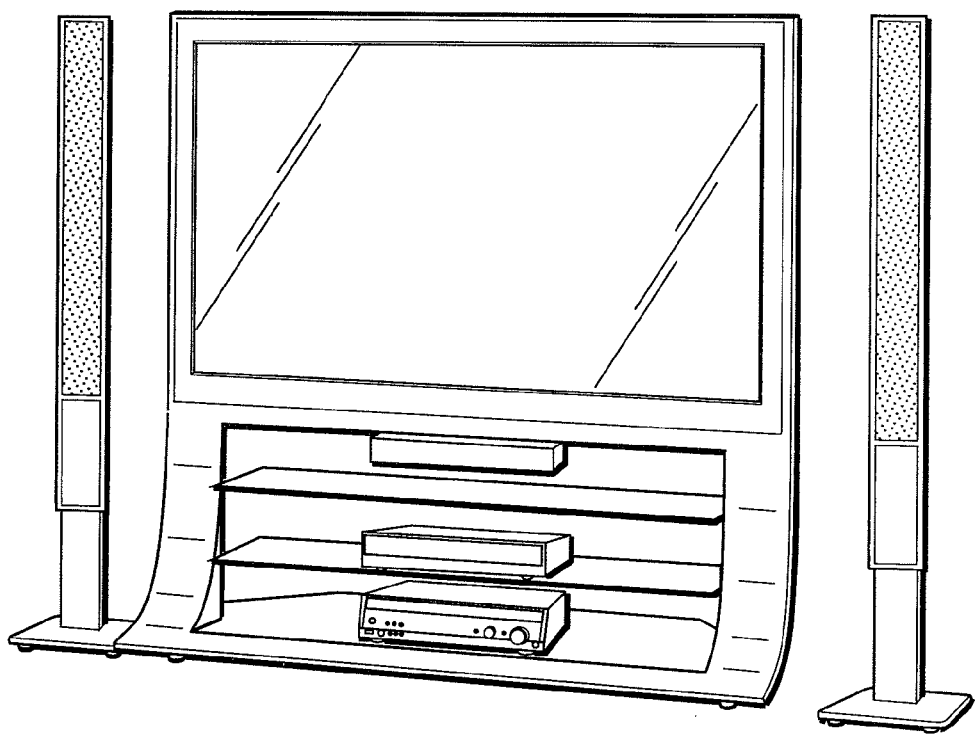
FIG. 15 is an outline drawing of a flat-screen TV equipped with a display device of the present invention.
Figure 16:
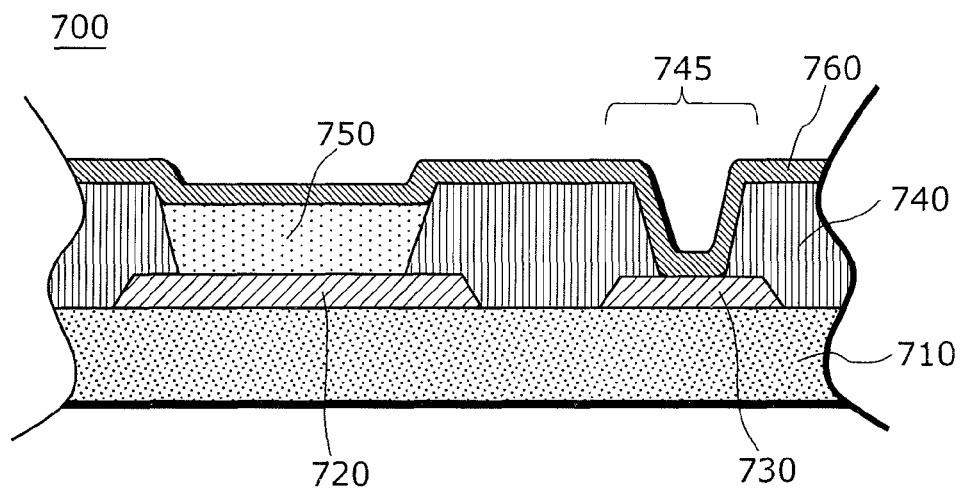
FIG. 16 is a cross-sectional view of a luminescent pixel included in a conventional display device in accordance with Patent Reference 1.
Figure 17:
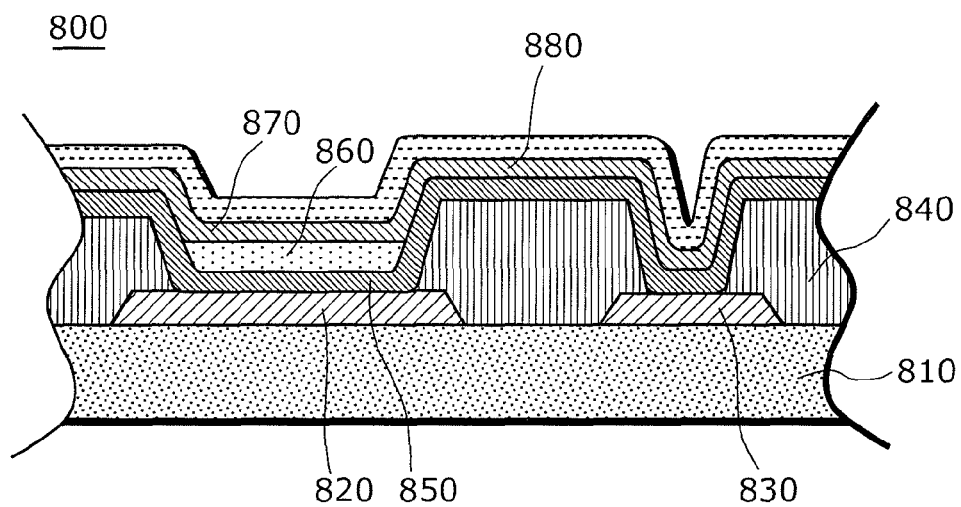
FIG. 17 is a cross-sectional view of a luminescent pixel included in a conventional display device in accordance with Patent Reference 3.

In addition, an organic EL display device in accordance with the present invention is included in a flat-screen TV shown in FIG. 15. The organic EL display device in accordance with the present invention is provided with overcurrent protection and is capable of reducing luminance variations. This makes possible realizing a flat-screen TV having high displaying quality.

INDUSTRIAL APPLICABILITY

An organic EL element in accordance with the present invention enjoys high efficiency, a low driving voltage, and a long life-time, and is effective as a pixel light source of a display device, a back light for a liquid crystal display, light sources for various lights, and a light source for an optical device. In particular, the organic EL element is suitably applied to an active matrix organic EL display panel combined with a TFT.

What is claimed is:

1. An organic electroluminescence display, comprising:
 a substrate;
 a first electrode one of on and in the substrate;
 an auxiliary wire one of on and in the substrate;
 a luminescent layer over the first electrode, the luminescent layer comprising a luminescent substance;
 a hole transport layer between the luminescent layer and the first electrode for transporting holes to the luminescent layer, the hole transport layer extending from over the first electrode to over the auxiliary wire, the hole transport layer comprising a non-n-doped organic material;
 a second electrode over the luminescent layer and extending from over the first electrode to over the auxiliary wire; and
 a metal layer over the auxiliary wire between the hole transport layer and the second electrode,
 wherein the second electrode and the auxiliary wire are electrically connected via the hole transport layer and the metal layer,
 the metal layer comprises a metal, and
 a difference of a work function value of the metal minus an absolute value of an energy level of a lowest unoccupied molecular orbit of the hole transport layer is at most approximately 0.5 eV.

2. The organic electroluminescence display according to claim 1,
 wherein the hole transport layer between the second electrode and the auxiliary wire is in contact with the metal layer and is n-doped.

3. The organic electroluminescence display according to claim 1,
 wherein the difference of the work function value of the metal minus the absolute value of the energy level of the lowest unoccupied molecular orbit of the hole transport layer is at least approximately −0.5 eV.

4. The organic electroluminescence display according to claim 1,
 wherein an n-dope concentration of the hole transport layer over the auxiliary wire is greater than an n-dope concentration of the hole transport layer over the first electrode.

5. The organic electroluminescence display according to claim 1,
 wherein the metal layer is a single layer that extends from over the auxiliary wire to over the first electrode.

6. The organic electroluminescence display according to claim 5,
 wherein the metal layer is an electron injection layer for injecting an electron into the luminescent layer over the first electrode.

7. The organic electroluminescence display according to claim 1,
 wherein metal atoms of the metal layer diffuse, over the auxiliary wire, to a vicinity of a second principal surface of the hole transport layer, the second principal surface being opposite a first principal surface of the hole transport layer that is an interface between the hold transport layer and the metal layer.

8. The organic electroluminescence display according to claim 7,
 wherein the vicinity of the second principal surface is at most approximately 5 nm from the second principal surface.

9. The organic electroluminescence display according to claim 1,
 wherein the hole transport layer over the auxiliary wire has a thickness greater than 0 nm and at most approximately 50 nm.

10. The organic electroluminescence display according to claim 1,
 wherein the substrate includes at least a first layer and a second layer that is different than the first layer,
 the first electrode is over the first layer, and
 the auxiliary wire is over the second layer.

11. The organic electroluminescence display according to claim 1, further comprising:
 a plurality of luminescent pixels arranged in a matrix, each of the plurality of luminescent pixels including the first electrode, the luminescent layer, and the second electrode,
 wherein, among the plurality of luminescent pixels, the first electrode and the luminescent layer of one of the plurality of luminescent pixels are separated from the first electrode and the luminescent layer of an other of the plurality of luminescent pixels, and
 the auxiliary wire of the plurality of luminescent pixels is arranged at least one of per column and per row in the matrix.

12. The organic electroluminescence display according to claim 11,
 wherein each of the plurality of luminescent pixels includes at least three sub-pixels,
 the first electrode and the luminescent layer for each of the plurality of pixels is separately provided for each of the at least three sub-pixels, and the auxiliary wire is arranged at least one of per column and per row of the at least three sub-pixels.

13. The organic electroluminescence display according to claim 11,
 wherein each of the plurality of luminescent pixels includes at least three sub-pixels,
 the first electrode and the luminescent layer for each of the plurality of pixels are separately provided for each of the at least three sub-pixels, and
 the auxiliary wire is arranged at least one of per column and per row of the plurality of luminescent pixels.

14. The organic electroluminescence display according to claim 1,
 wherein the substrate includes:
 an interlayer insulating layer below the first electrode; and
 a driving circuit layer below the interlayer insulating layer that includes a driver that drives a luminescent pixel that includes the first electrode, the luminescent layer, and the second electrode, and
 the first electrode and the driver are connected via a conductive channel provided in the interlayer insulating layer.

15. The organic electroluminescence display according to claim 14,
 wherein the driver includes a thin-film transistor, and
 the first electrode is connected to one of a source terminal and a drain terminal of the driver via the conductive channel.

16. A method of manufacturing an organic electroluminescence display having a luminescent pixel, the method comprising:

providing a first electrode one of on and in a substrate;
providing an auxiliary wire one of on and in the substrate;
providing a hole transport layer over the first electrode and over the auxiliary wire, the hole transport layer comprising a non-n-doped organic material;
providing a luminescent layer over the first electrode, the hole transport layer between the luminescent layer and the first electrode for transporting holes to the luminescent layer, the luminescent layer comprising a luminescent substance;
providing a metal layer over the auxiliary wire and over the hole transport layer;
providing a second electrode over the luminescent layer and extending from over the first electrode to over the auxiliary wire, the metal layer between the second electrode and the hole transport layer, the second electrode and the auxiliary wire being electrically connected via the metal layer and the hole transport layer,
wherein the metal layer comprises a metal, and
a difference of a work function value of the metal minus an absolute value of an energy level of a lowest unoccupied molecular orbit of the hole transport layer is at most approximately 0.5 eV.

17. The method according to claim 16,
wherein each of the metal layer and the hole transport layer are provided in a single layer extending from over the first electrode to over the auxiliary wire.

18. The method according to claim 16,
wherein the substrate includes at least a first layer and a second layer that is different from the first layer, and
the first electrode is provided over the first layer and the auxiliary wire is provided over the second layer.

19. The method according to claim 16,
wherein successive dry processes are used, in order, to provide the metal layer and the second electrode over the auxiliary wire.

20. The method according to claim 16, further comprising, before
providing the first electrode the one of one and in the substrate and providing the auxiliary wire the one of one and in the substrate:
providing a driving circuit layer in the substrate, the driving circuit layer including a driver that drives the luminescent pixel; and
providing an interlayer insulating layer on the driving circuit layer as a top layer of the substrate, the interlayer insulating layer including a conductive channel that electrically interconnects the driver and the first electrode.

* * * * *